United States Patent
Fukushige et al.

(10) Patent No.: US 7,229,737 B2
(45) Date of Patent: *Jun. 12, 2007

(54) PHOTOPOLYMERIZABLE COMPOSITION AND RECORDING MATERIAL AND RECORDING PROCESS USING THE SAME

(75) Inventors: Yuuichi Fukushige, Shizuoka-ken (JP); Shintaro Washizu, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 264 days.

This patent is subject to a terminal disclaimer.

(21) Appl. No.: 09/894,827

(22) Filed: Jun. 29, 2001

(65) Prior Publication Data

US 2002/0051927 A1    May 2, 2002

(30) Foreign Application Priority Data

Jun. 30, 2000   (JP)   ............................. 2000-199351
Jun. 26, 2001   (JP)   ............................. 2001-193126

(51) Int. Cl.
*G03F 7/029*    (2006.01)
*G03F 7/38*     (2006.01)

(52) U.S. Cl. .................. 430/138; 430/151; 430/171; 430/281.1; 430/288.1

(58) Field of Classification Search ............. 430/288.1, 430/138, 157, 171, 281.1, 151
See application file for complete search history.

(56) References Cited

U.S. PATENT DOCUMENTS

| | | | |
|---|---|---|---|
| 4,399,209 A | 8/1983 | Sanders et al. | 430/138 |
| 4,440,846 A | 4/1984 | Sanders et al. | 430/138 |
| 4,576,891 A | 3/1986 | Adair et al. | 430/138 |
| 4,842,976 A | 6/1989 | Sanders et al. | 430/138 |
| 4,865,942 A * | 9/1989 | Gottschalk et al. | 430/138 |
| 5,055,372 A | 10/1991 | Shanklin et al. | |
| 5,124,236 A | 6/1992 | Yamaguchi et al. | |
| 5,250,384 A * | 10/1993 | Yamaguchi et al. | 430/138 |
| 5,283,015 A * | 2/1994 | Hutchings et al. | 264/4.7 |
| 5,346,801 A | 9/1994 | Watanabe et al. | |
| 6,022,664 A | 2/2000 | Washizu et al. | 430/138 |
| 6,096,794 A * | 8/2000 | Cunningham et al. | 522/12 |
| 6,210,863 B1 * | 4/2001 | Cunningham et al. | 430/281.1 |

FOREIGN PATENT DOCUMENTS

| | | |
|---|---|---|
| JP | A-3-87827 | 4/1991 |
| JP | A-4-211252 | 8/1992 |

\* cited by examiner

*Primary Examiner*—John S. Chu
(74) *Attorney, Agent, or Firm*—Sughrue Mion, PLLC

(57) ABSTRACT

Disclosed is a photopolymerizable composition containing a polymerizable compound having an addition-polymerizable unsaturated bond, an organic dye, and an organoboron compound represented by the following general formula (I), wherein at least one kind of the organoboron compound is included and the proportion thereof is one mole or more per mole of the organic dye $$B^{\ominus}{-}(R)_4 X^{\oplus}.$$   General formula (I)

25 Claims, No Drawings

PHOTOPOLYMERIZABLE COMPOSITION AND RECORDING MATERIAL AND RECORDING PROCESS USING THE SAME

BACKGROUND OF THE INVENTION

1. Field of the Invention

The present invention relates to a photopolymerizable composition for use in a monochrome or polychrome (multicolor) recording material and recording process which can utilize a light source falling within an ultraviolet to infrared region. More specifically, the present invention relates to a photopolymerizable composition exhibiting improved sensitivity, storability, fixability by light, decolorization of organic dyes, etc., and to a recording material and a recording process using the photopolymerizable composition.

2. Description of the Related Art

Heretofore, dry-type image-recording processes, which do not use a liquid developing solution or the like and do not produce waste, have been studied. Among these processes, a process using a composition that hardens by light is drawing attention.

According to this process, when a recording material is exposed to light, a composition, hardenable by the action of light and contained in an exposed portion of the recording material, is hardened and thus a latent image is formed. Meanwhile, a component, which is to be involved in a coloration or decolorization reaction when heated and is contained in an unexposed portion of the recording material, moves within the recording material so that a color image is formed. When a recording material according to the above-described process is used, a visible image is formed by irradiating the recording material with light through an image original so that the portion exposed to light is hardened and a latent image is formed and thereafter heating the recording material so that a component, which is to be involved in a coloration or decolorization reaction and is contained in an unhardened portion (i.e., unexposed portion), moves.

According to this process, it is possible to realize a perfectly dry system that produces no waste.

Specifically, there are several kinds of recording materials as the recording materials to be used according to the above-described process. This process is useful for recording color images in particular, although this process is a characteristic one also as a recording process for black-and-white images. Known as a specific recording material is, for example, the two-component, photo- and heat-sensitive, color-forming recording material disclosed in Japanese Patent Application Laid-Open (JP-A) No. 52-89915. This is a heat-sensitive, color-forming recording material which uses, for example, an electron-accepting compound and an electron-donating, colorless dye as the two components and contains a photo-hardenable composition either inside or outside microcapsules or both inside and outside microcapsules.

However, in this recording material, even if the photo-hardenable composition inside microcapsules is fully hardened, the coloration in the hardened portions cannot be sufficiently inhibited. Because of this, non-image portions are colored and contrast tends to decrease.

Known as a recording material whose non-image portions are free from coloration is, for example, the recording material which is disclosed in JP-A No. 61-123838 and produced by laminating a layer containing a composition consisting of a vinyl monomer having an acidic group and a photopolymerization initiator, an isolating layer, and a layer comprised of an electron-donating, colorless dye.

This recording material is associated with the problem that the density of developed color itself is relatively low, although non-image portions, i.e., the portions hardened by a photopolymerization reaction, are free from coloration because the thermal diffusion of the acidic group does not occur in the non-image portions.

JP-A No. 60-119552 discloses a recording material which provides a negative-type image by a similar process. In this recording material, a photopolymerizable composition, which comprises of a monomer or prepolymer designed to bleach a dye and a photopolymerization initiator, and a dye, which is to be bleached by a monomer or prepolymer, are isolated from each other. This recording material is also associated with the problem that the density of developed color itself is relatively low, although non-image portions are free from coloration as in the case of the recording material described above.

In view of the problems described above, the present applicant has proposed the recording material described in JP-A No. 3-87828 and the recording material described in JP-A No. 4-211252 as recording materials capable of decreasing the coloration in non-image portions and providing a high image density. The former recording material is characterized in that one of the two components in the two-component, photo- and heat-sensitive, color-forming recording material is enclosed in microcapsules while the other component is present as a hardenable compound of the photopolymerizable composition or is present together with the photopolymerizable composition outside the microcapsules. The latter recording material is a photo- and heat-sensitive recording material having a layer containing microcapsules enclosing an electron-donating, colorless dye and a photo-hardenable composition comprising of an electron-accepting compound, a polymerizable vinyl monomer, and a photopolymerization initiator outside the microcapsules.

Recording of color images in the photo- and heat-sensitive recording materials described above can be achieved by using a recording material comprising a support having laminated thereon plural recording layers each of which is sensitive to a different wavelength and forms a different color.

An example of multicolor photo- and heat-sensitive recording materials is the photo- and heat-sensitive recording material previously proposed by the present applicant. More specifically, examples thereof include a multicolor photo- and heat-sensitive recording material comprising plural recording layers each of which is sensitive to a different wavelength and forms a different color. That is, the multicolor photo- and heat-sensitive recording material is produced by laminating a first recording layer which is sensitive to the light having a central wavelength of $\lambda_1$ and develops (forms) a color, an intermediate layer which absorbs the light having a central wavelength of $\lambda_1$, a second recording layer which is sensitive to the light having a central wavelength of $\lambda_2$ and develops a color different from the color of the first recording layer, . . . , an intermediate layer which absorbs the light having a central wavelength of $\lambda_{i-1}$, and an i th recording layer which is sensitive to the light having a central wavelength of $\lambda_i$ and develops a color different from the colors of the first, second, . . . , and (i−1) th recording layers, in that order in the direction of the support from the light source for exposure, wherein i is equal to or greater than 2 and the central wavelengths have the relationship of $\lambda_1 < \lambda_2 < \ldots \lambda_i$. For example, i may be 3, 4, 5, 6 or 7. Further, the i th recording layer is formed on the support. this construction of the multicolor photo- and heat-sensitive recording material may be used in the present invention.

These recording materials can be used in various applications, but, when these recording materials are used, a light source that enables the image recording was limited to UV light or shortwave visible light and the use of a small-sized, inexpensive infrared laser or blue to red light was impossible.

In order to enable more rapid and finer image formation, a dye or the like, whose absorption wavelength falls within the ultraviolet to infrared region of the irradiation light, needs to be introduced into the recording layer when the small-sized, inexpensive infrared laser or blue to red light is used. However, if a dye or the like, particularly a dye or the like whose absorption wavelength falls within a visible light region, is used, the background is colored and the images to be obtained necessarily have a low contrast and poor quality. On the other hand, the use of a dye or the like whose absorption wavelength falls within a near-infrared region diminishes the coloration of the background. But in this case, the problem is that the laser required is expensive.

Meanwhile, examples of pressure-sensitive, color-forming recording materials include the photo- and pressure-sensitive, recording materials disclosed in U.S. Pat. No. 4,399,209, U.S. Pat. No. 4,440,846, and others. In these recording materials, a colorant precursor as an image former is enclosed in microcapsules and, after image-wise exposure, the microcapsules in the portions that have not undergone photo-hardening are broken by the application of a uniform pressure. As a result, the colorant precursor released from the microcapsules reacts with the developing agent present outside the microcapsules and thus visualization is performed. Examples of these multicolor recording materials include the recording materials described in U.S. Pat. Nos. 4,842,976 and 4,576,891.

However, also in these recording materials, like the photo- and heat-sensitive recording materials described above, almost all compositions to be photo-hardened have sensitivity only to shortwave light, and a light source that enables the image recording was limited to UV light or shortwave visible light. Therefore, the use of a small-sized, inexpensive infrared laser or blue to red light was impossible.

Another problem was that, in order to enable more rapid and finer image formation, it was inevitable that the background was colored and the images obtained had a low contrast and poor quality.

SUMMARY OF THE INVENTION

It is accordingly the task of the present invention to solve the problems in the prior art and achieve the following objectives.

An object of the present invention is to provide a photopolymerizable composition having better qualities in terms of sensitivity, storability, photo-fixability, decolorization of organic dyes, etc. Another object of the present invention is to provide a black-and-white or color recording material and a recording process that enable recording by a blue through to red laser, a small-sized inexpensive laser, or the like and enable the formation of a high-contrast and high-quality image with high sensitivity in a perfectly dry processing system requiring no developing liquid or the like and producing no waste by use of the above-mentioned photopolymerizable composition.

The present inventors conducted extensive studies on the image-recording process in an image-recording material comprising the steps of exposing the image-recording material to light according to a desired image so as to form a latent image by hardening a composition (hereinafter referred to as "photopolymerizable composition"), which hardens by photopolymerization and is present outside microcapsules, and heating or pressing the recording material so as to cause color-forming components to develop a color. As a result, the present inventors found that a high-quality image excellent in contrast and image quality can be obtained with excellent sensitivity by using a specific photopolymerization initiator in the recording layer and irradiating the recording layer surface with light after image formation so as to fix the image formed and decolorize the remnant photopolymerization initiator component. Based on this finding, they have achieved the present invention.

The means to solve the task described above are as follows.

The first aspect of the present invention is a photopolymerizable composition. The photopolymerizable composition comprises (a) a polymerizable compound having an addition-polymerizable unsaturated bond, (b) an organic dye and (c) at least one kind of an organoboron compound represented by the following general formula (I). The at least one kind of an organoboron compound is comprised in the composition in a proportion of at least one mole per mole of the organic dye.

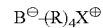 General formula (I)

In the formula (I), R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se.

The second aspect of the present invention is a recording material comprising a support and at least one recording layer provided thereon. The at least one recording layer includes a photopolymerizable composition comprising (a) a polymerizable compound having an addition-polymerizable unsaturated bond, (b) an organic dye and (c) at least one kind of an organoboron compound represented by the following general formula (I) in a proportion of at least one mole per mole of the organic dye:

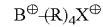 General formula (I)

wherein R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se.

The third aspect of the present invention is an image-recording process. The process comprises the steps of:

(a) preparing a recording material by laminating at least one recording layer on a support, with the at least one recording layer including a photopolymerizable composition comprising (i) a polymerizable compound including an addition-polymerizable unsaturated bond, (ii) an organic dye, and (iii) at least one kind of an organoboron compound represented by the following general formula (I) in a proportion of at least one mole per mole of the organic dye

   General formula (I)

wherein R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se;

(b) exposing the recording layer image-wise to light at least once using at least one light source so that the photopolymerizable composition forms a latent image;

(c) heating the recording material so that the color-forming components develop colors according to the latent image to form an image; and (d) irradiating the recording layer surface with light so as to fix the image formed and decolorize the organic dyes.

DESCRIPTION OF THE PREFERRED EMBODIMENTS

The photopolymerizable composition of the present invention and the recording material and the recording process using the photopolymerizable composition are explained in detail below.

The recording material, which suitably uses the photopolymerizable composition of the present invention, is a photo- and heat-sensitive type recording material comprising a support having at least one of photo- and heat-sensitive layer provided thereon or is a photo- and pressure-sensitive type recording material comprising a support having at least one of photo- and pressure-sensitive layer provided thereon. Examples of these recording materials include (a) a photo- and heat-sensitive recording material comprising a support having a photo- and heat-sensitive layer provided thereon which layer contains heat-responsive microcapsules enclosing a color-forming component A and contains, outside the microcapsules, a photopolymerizable composition comprising at least a substantially colorless compound B having in the molecule thereof polymerizable group and a site which reacts with the color-forming component A to develop a color, and a photopolymerization initiator; (b) a photo- and heat-sensitive recording material comprising a support having a photo- and heat-sensitive layer provided thereon which layer includes heat-responsive microcapsules enclosing a color-forming component A and contains, outside the microcapsules, a photopolymerizable composition comprising at least a substantially colorless compound C which reacts with the color-forming component A to develop a color, a substantially colorless compound D having in the molecule thereof a polymerizable group and a site which inhibits the reaction between the color-forming component A and the compound C, and a photopolymerization initiator; or (c) a photo- and pressure-sensitive recording material comprising a support having a photo- and pressure-sensitive layer provided thereon which layer includes microcapsules enclosing at least a color-forming component A, a polymerizable compound, and a photopolymerization initiator and contains, outside the microcapsules, at least a substantially colorless compound E designed to react with the color-forming component A to develop a color.

Alternatively, the recording material described above comprises a support having one or more of the photo- and heat-sensitive layers or photo- and pressure-sensitive layers provided thereon.

In the photo- and heat-sensitive recording material (a), exposure to light according to a desired image causes the photopolymerizable composition present outside the microcapsules to harden by a polymerization reaction due to the radical generated from the photopolymerization initiator so that a latent image in a desired shape is formed. Next, when the recording material is heated, the compound B present in unexposed portions moves within the recording material and reacts with the color-forming component A inside the capsules to develop a color.

Accordingly, the photo- and heat-sensitive image-recording material (a) is a positive-type, photo- and heat-sensitive recording material in which the image formation is performed such that color formation does not take place in exposed portions but take place in the unexposed portions that do not harden. Further, the microcapsules in and out the exposed portions are not broken.

In the photo- and heat-sensitive recording material (b) exposure to light according to a desired image causes the compound D having a polymerizable group to harden by a polymerization reaction due to the radical generated from the photopolymerization initiator so that a latent image formed in a desired shape. Next, depending on the film property of the latent image (i.e., hardened portion), the compound C moves and reacts with the color-forming component A inside the capsules to form an image.

Accordingly, the photo- and heat-sensitive image-recording material (b) is a negative-type, photo- and heat-sensitive recording material in which the image formation is performed such that color formation is made in the exposed portions.

In the photo- and pressure-sensitive recording material (c), exposure to light according to a desired image causes the polymerizable compound present inside the microcapsules to harden the capsule interior by a polymerization reaction due to the radical generated from the photopolymerization initiator upon exposure so that a latent image in a desired shape is formed. That is, in the exposed portions, the color-forming reaction with the compound E present outside the capsules is inhibited. Next, when pressure is applied to the recording material, since the microcapsules are broken, the compound E present in unexposed portions moves within the recording material and reacts with the color-forming component A present inside the capsules to develop a color.

Accordingly, the photo- and pressure-sensitive image-recording material (c) is a positive-type, photo- and pressure-sensitive recording material in which the image formation is performed such that color formation is not made in exposed portions but color formation is made in the unexposed portions that do not harden.

Also possible is a recording material comprising a support and a photo- and heat-sensitive recording layer or photo- and pressure-sensitive recording layer comprising plural recording layers formed on the support. In this case, a multicolor image can be realized using a recording material produced by laminating a plurality of single-color recording layers, each of which contains microcapsules enclosing a color-forming component A designed to form a different color, and irradiating the recording material with a plurality of light sources each having a different wavelength.

Specific aspect of the recording materials described above include the following (1) to (3).

(1) A positive-type photo- and heat-sensitive recording described in JP-A No. 3-87827, and this recording material has a photo- and heat-sensitive recording layer containing, outside microcapsules, a photopolymerization initiator and a photo-hardenable composition, which contains a compound having in the molecule thereof an electron-accepting group and a polymerizable group, and microcapsules enclosing an electron-donating, colorless dye.

In this photo- and heat-sensitive recording material, exposure to light causes the photopolymerizable composition present outside the microcapsules to harden by a polymerization reaction so that a latent image is formed. Next, when the recording material is heated, the electron-accepting compound present in unexposed portions moves within the recording material and reacts with the electron-donating, colorless dye present inside the capsules to develop a color. Accordingly, the color formation is performed such that the latent image portions that harden in the exposed portions do not develop a color and only the unexposed portions that do not harden develop a color. As a result, a high-contrast, sharp, positive image can be formed.

(2) A negative-type photo- and heat-sensitive recording is described in JP-A No. 4-211252. This recording material has a photo- and heat-sensitive recording layer containing, outside microcapsules, an electron-accepting compound, a polymerizable vinyl monomer, and a photopolymerization initiator, and microcapsules enclosing an electron-donating, colorless dye.

Although the mechanism of this photo- and heat-sensitive recording material is not clear, exposure to light causes the vinyl monomer present outside the microcapsules to polymerize. On the other hand, the electron-accepting compound present in exposed portions is not taken into the polymer thus formed. On the contrary, the interaction between the electron-accepting compound and the vinyl monomer is reduced and the electron-accepting compound is present in a mobile state with a high diffusion speed.

Meanwhile, the electron-accepting compound in the unexposed portions is present in a state in which it is trapped in the existing vinyl monomer. Therefore, heating of the recording material causes the electron-accepting compound in the exposed portions to preferentially move within the recording material and to react with the electron-donating, colorless dye in the microcapsules. This phenomenon is believed to occur because the electron-accepting compound in the unexposed portions cannot pass through the capsule wall even if heat is applied and does not react with the electron-donating, colorless dye and therefore the electron-accepting compound in the unexposed portions cannot contribute to the color formation. Accordingly, the color formation is performed such that the exposed portions develop a color but the unexposed portions do not develop a color. As a result, a high-contrast, negative image can be formed.

(3) A positive-type photo- and pressure-sensitive recording is described in U. S. Pat. No. 4,399,209, and this recording material has a photo- and pressure-sensitive recording layer containing a developing agent outside the microcapsules and microcapsules enclosing a photopolymerizable composition and a colorant precursor.

In this photo- and pressure-sensitive recording material, exposure to light causes the photopolymerizable composition present inside the microcapsules to harden so that a latent image is formed. Next, when pressed, the developing agent present in unexposed portions moves within the recording material and reacts with the colorant precursor present inside the capsules so that a color is formed. Accordingly, the color formation is performed such that the latent image portions that harden in the exposed portions do not develop a color and only the unexposed portions that do not harden develop a color. As a result, a high-contrast, sharp, positive image can be formed.

<Photopolymerizable Composition>

The photopolymerizable composition for use in the present invention can be preferably used in the recording material of the present invention described above and in the recording process that is described later. The photopolymerizable composition for use in the present invention comprises at least a polymerizable compound having at least one addition-polymerizable unsaturated bond (hereinafter this compound is referred to simply as "polymerizable compound" upon occasion), and organic dye, and an organoboron compound represented by the general formula (I) (hereinafter this organoboron compound is referred to simply as "organoboron compound" upon occasion), wherein at least one kind of the organoboron compound is included and the proportion thereof is one mole or more per mole of the organic dye.

That is, in the photopolymerizable composition of the present invention, when an organic dye and an organoboron compound are each added, the ratio between the organic dye and the organoboron compound is important from the standpoint of obtaining high sensitivity and sufficient decolorization by the irradiation of light in the fixing step of the recording process described later.

In addition to the required ratio between the organic dye and the organoboron compound (1/1 in molar ratio), it is particularly preferable to add the organoboron compound in a copious amount for sufficient decolorization of the organic dye remaining in the recording layer from the standpoint of obtaining high sensitivity and sufficient decolorization.

The ratio between the organic dye and the organoboron compound to be used is preferably in the range of 1/1 to 1/50, more preferably in the range of 1/1.2 to 1/30, and most preferably in the range of 1/1.2 to 1/20. If the ratio is less than 1/1, or the amount of the organoboron compound to be added is less than 1 mole per mole of the organic dye, sufficient polymerization reactivity and decolorization cannot be obtained. On the other hand, if the ratio is more than 1/50, or the amount of the organoboron compound to be added is more than 50 mole per mole of the organic dye, coatability is undesirably impaired.

Accordingly, in the present invention, such properties as sensitivity, storability, photo-fixability, and decolorization of organic dyes can be improved by use of the organoboron compound in an amount exceeding 1 mole per mole of the organic dye.

A single kind or plural kinds of the organoboron compounds can be used in the photopolymerizable composition of the present invention. If plural kinds of the organoboron compounds are used, the total amount of all of the organoboron compounds needs to be 1 mole or more. The use of plural kinds of organoboron compounds in combination enables the utilization of the organoboron compounds effective in raising sensitivity from various aspects.

The total amount of the organic dye and the organoboron compound in the photopolymerizable composition of the present invention is preferably in the range of 0.1 to 10% by mass, more preferably in the range of 0.1 to 5% by mass, and most preferably in the range of 0.1 to 1% by mass based on the amount to be used of the polymerizable compound having at least one addition-polymerizable unsaturated bond described later. If the amount to be used is less than 0.1% by mass, the effect of the present invention cannot be obtained, whereas the amount exceeding 10% by mass undesirably impairs storability and coatability.

The organic dye and the organoboron compound function as a photopolymerization initiator which, when exposed to light, generates a radical and causes a polymerization reaction in the layer and accelerates the reaction. The polymerization reaction causes the recording layer to harden so that a latent image in a desired shape is formed. The photopolymerization initiator, i.e., the organic dye and the organoboron compound, can be used in any of the recording materials (a) to (c) described previously.

(Organic Dye)

The organic dyes for use in the present invention may be suitably selected from conventionally known compounds. Among these dyes, the organic dye is preferably an organic dye having a maximum absorption wavelength falling within a range of 300 to 1000 nm.

By selecting any desired dye from the organic dyes having the wavelength range within described above and adjusting the sensitive wavelength to match the light source to be used, it becomes possible to obtain a high sensitivity. Also, it is possible to suitably select a light source such as blue, green, or red light, an infrared laser, or the like for use in image-wise exposure to light.

Accordingly, for example when a color image is to be formed using an image-forming material, which is a multicolor recording material made by laminating single-color recording layers designed to develop different colors, a high sensitivity and a high level of image sharpness can be provided to the multicolor recording material. This is because, also in the recording material having the laminated construction, each layer (each color) has a high sensitivity and forms highly sharp images by the incorporation of organic dyes, which function as spectral sensitizing dyes having different absorption wavelengths, in the single-color image forming layers designed to develop different colors and by the use of light sources suited to the absorption wavelengths.

Specific examples of the organic dyes include those described in patent literature regarding "organoboron compounds" that is described later, Research Disclosure, Vol. 200, 1980, December, Item 20036, and Sensitizers, K. Tokumaru, et al., Eds., pp. 160-163, Kodansha Publishing Co., Ltd in 1987. The organic dyes to be incorporated in the photopolymerizable composition of the present invention may be any organic dyes selected from cationic dyes, anionic dyes, and nonionic dyes.

Specific examples of the organic dyes include 3-ketocoumarin compounds described in JP-A No. 58-15603, thiopyrylium salts described in JP-A No. 58-40302, naphthothiazolemerocyanine compounds described in Japanese Patent Application Publication (JP-B) Nos. 59-28328 and 60-53300, merocyanine compounds described in JP-B Nos. 61-9621 and 62-3842, and JP-A Nos. 59-89303 and 60-60104, and merocyanine dyes containing thiobarbituric acid, hemioxanole dyes, and cyanine, hemicyanine, and merocyanine dyes having indolenine nuclei described in JP-A Nos. 62-150242 and 64-59345, JP-B No. 8-9643, and Japanese Patent Application Nos. 11-20089, 11-323838, 11-367432, 2000-34935, 2000-38861, 2000-38872, and 2000-142112.

Other examples of the organic dyes include the dyes described in Chemistry of Functional Dyes (1981, CMC Publishing Co., Ltd., pp. 393-416) and Coloring Materials (60 [4], 212-224, 1987). Specific examples of these organic dyes include cationic methine dyes, cationic carbonium dyes, cationic quinoimine dyes, cationic indoline dyes, and cationic styryl dyes.

Examples of the above-mentioned dyes include keto dyes such as coumarin dyes (including ketocoumarin and sulfonocoumarin), merostyryl dyes, oxonol dyes, and hemioxonol dyes; nonketo dyes such as nonketopolymethine dyes, triarylmethane dyes, xanthene dyes, anthracene dyes, rhodamine dyes, acridine dyes, aniline dyes, and azo dyes; nonketopolymethine dyes such as azomethine dyes, cyanine dyes, carbocyanine dyes, dicarbocyanine dyes, tricarbocyanine dyes, hemicyanine dyes, and styryl dyes; quinoneimine dyes such as azine dyes, oxazine dyes, thiazine dyes, quinoline dyes, and thiazole dyes; and so on.

Specific examples of the above-mentioned cationic, anionic, and nonionic organic dyes (1-1 to 3-15) are given below. However, it should be noted that the present invention is not limited to these examples.

(Cationic organic dyes)

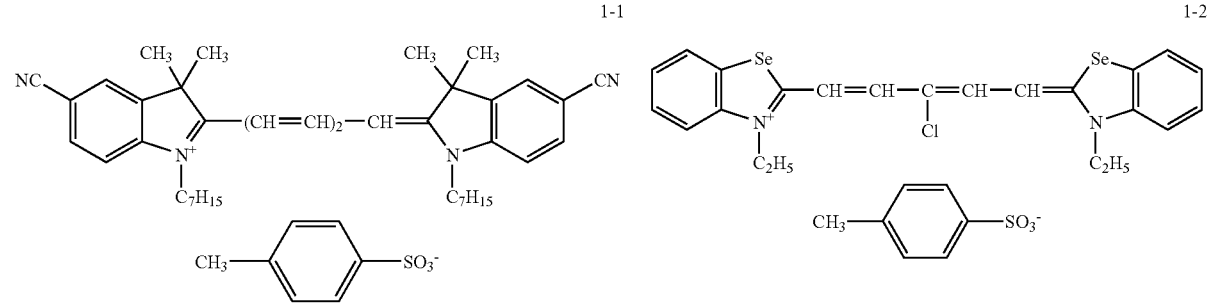

-continued
1-3
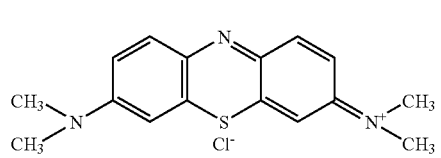
1-4
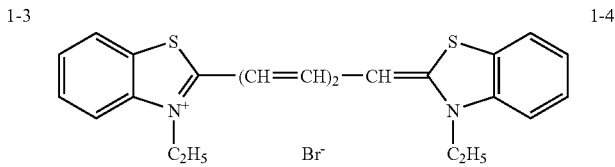
1-5
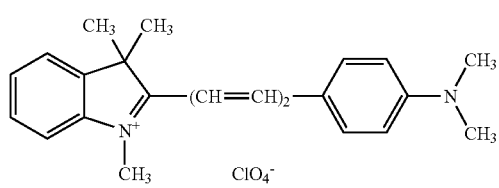
1-6
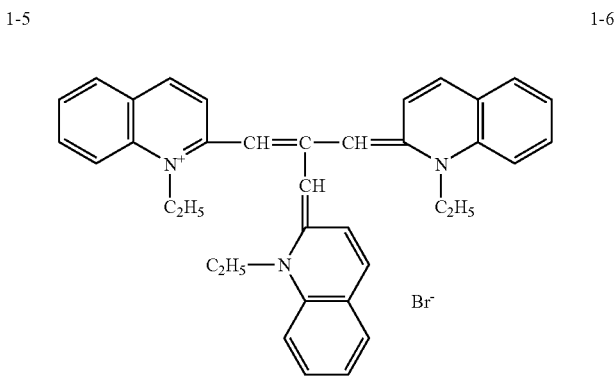
1-7
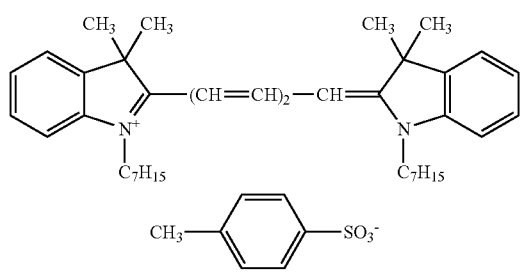
1-8
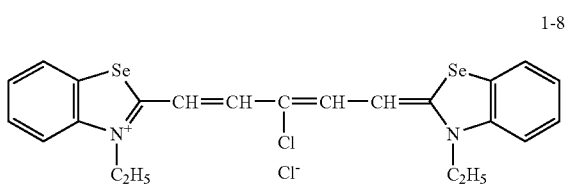
1-9
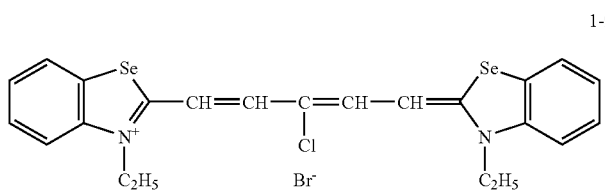
1-10
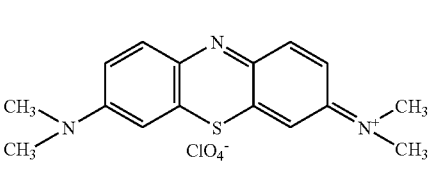
1-11
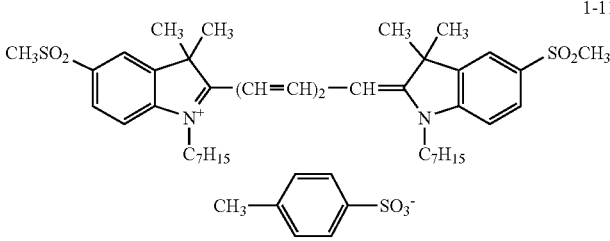
1-12
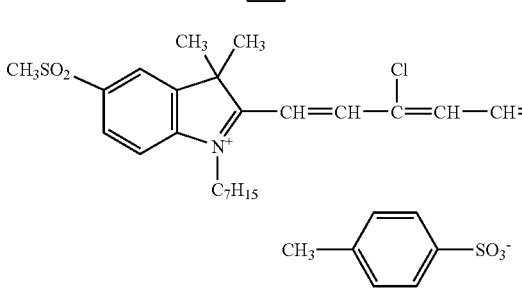

-continued
1-13
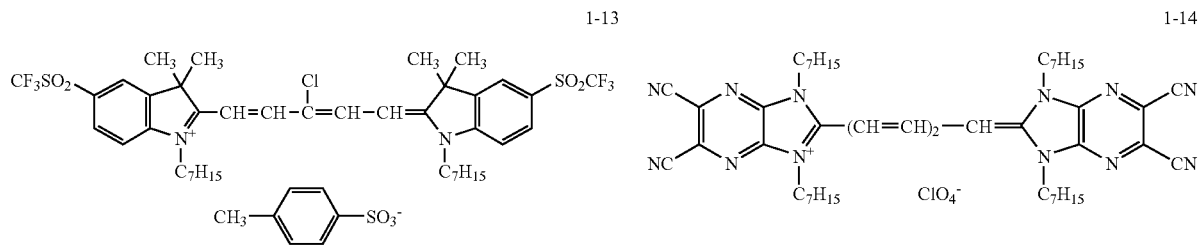
1-14
1-15
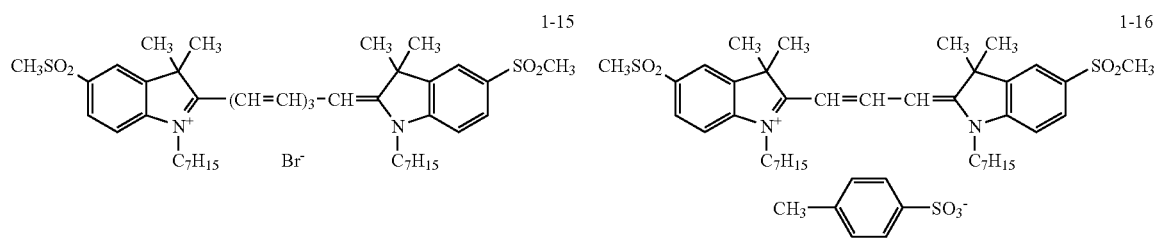
1-16
1-17
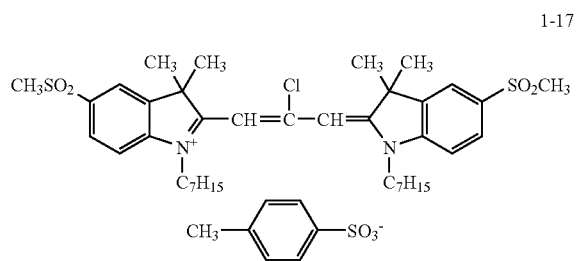
1-18
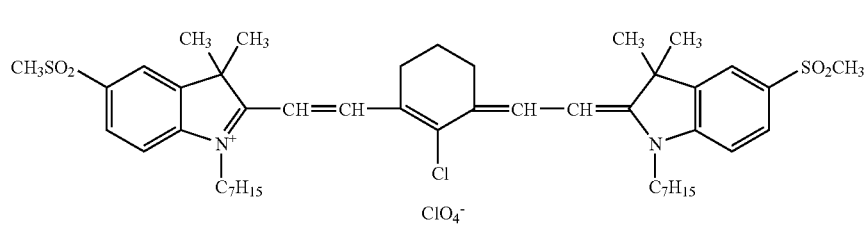
(Anionic organic dyes)
2-1
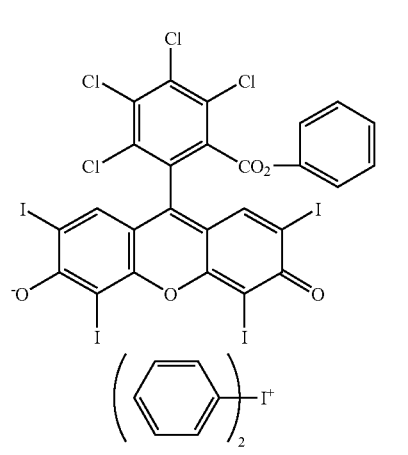
2-2
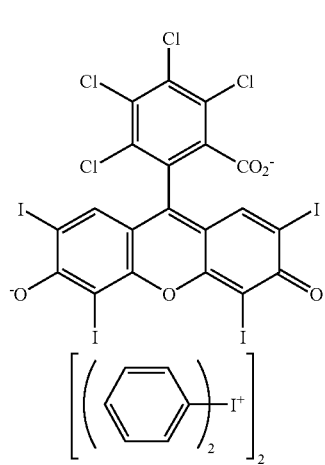

-continued
2-3
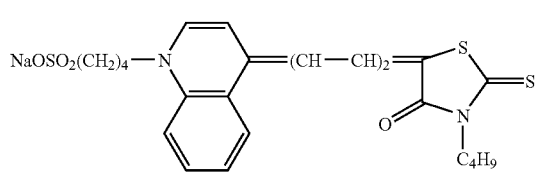
2-4
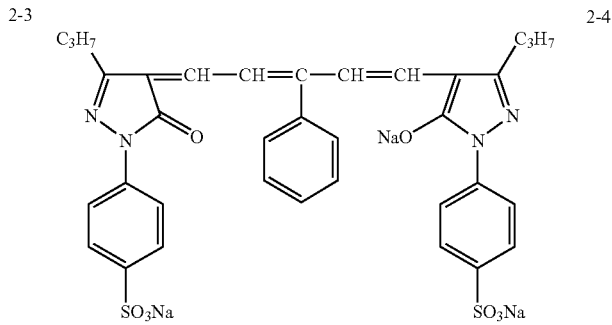
2-5
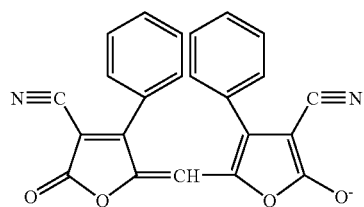
(Nonionic organic dyes)
3-1
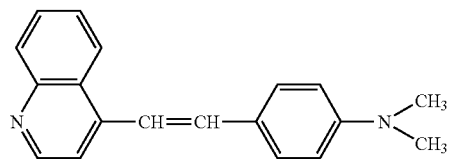
3-2
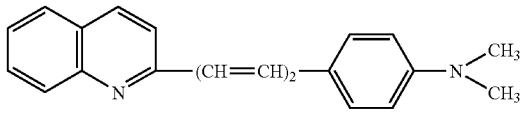
3-3
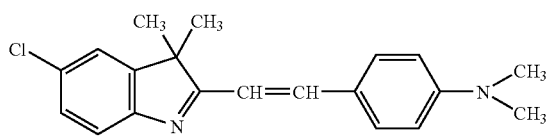
3-4
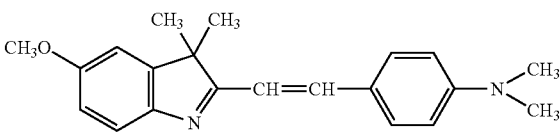
3-5
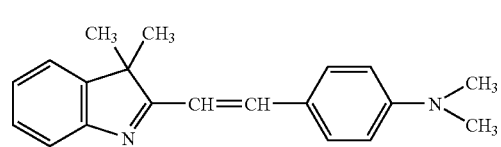
3-6
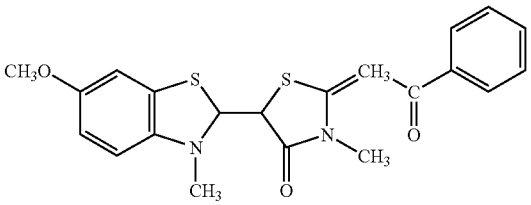
3-7
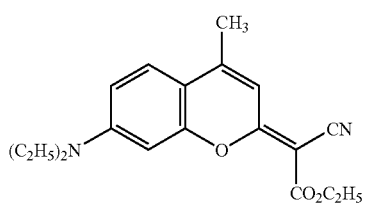
3-8
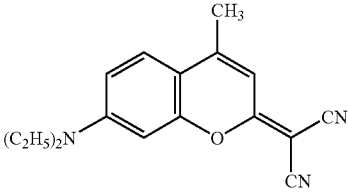
3-9
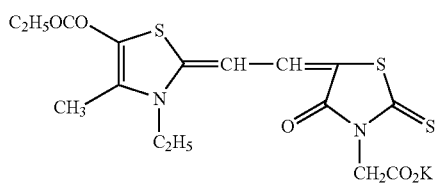
3-10
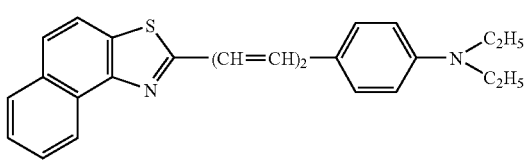

-continued 3-11

3-12

3-13

3-14

3-15

The proper use of the above-mentioned organic dyes enables the spectral sensitivity of the photopolymerizable composition of the present invention to fall within the range of ultraviolet light to infrared light.

The organic dyes may be used singly or in combinations of two or more.

The amount of the organic dye to be used is preferably in the range of 0.1 to 5% by mass, more preferably in the range of 0.3 to 3.5% by mass, most preferably in the range of 0.5 to 2% by mass, based on the total mass of the photo- and heat-sensitive recording layer or the photo- and pressure-sensitive recording layer.

(Organoboron Compound)

The organoboron compound incorporated in the photopolymerizable composition of the present invention is an organoboron compound represented by the following general formula (I). Examples of the organoboron compound include the organoboron compounds described in JP-A Nos. 62-143044, 9-188685, 9-188686, and 9-188710, and Japanese Patent Application No. 11-108466. In the presence of the organoboron compound, the organic dye described above efficiently responds to the light source for exposure emitting light in the spectral absorption wavelength region. Therefore, the sensitivity is raised and the radical generation can be controlled by use of any light source emitting light in an ultraviolet to infrared region.

$$B^{\ominus}(R)_4 X^{\oplus} \quad \text{General formula (I)}$$

In the general formula (I), R is selected from an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof. Plural Rs may be the same as or different from each other. In addition, two or more of these groups may join together directly or via a substituent and form a boron-containing heterocycle.

X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se.

Specific examples of the above-mentioned organoboron compounds (((1) to (36) and (A-1) to (A-40)) are given below. However, it should be noted that the present invention is not limited to these examples.

(1)

(1-i)

(1-ii)

(1-iii)

(2)

(3)

-continued
(4)
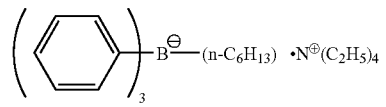
(5)
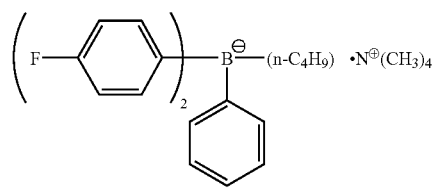
(6)
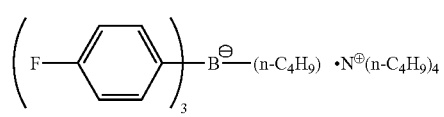
(6-i)
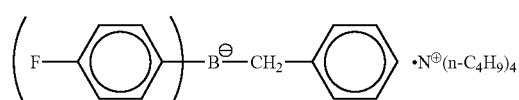
(6-ii)
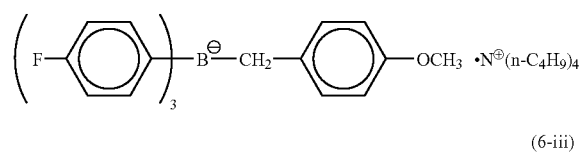
(6-iii)
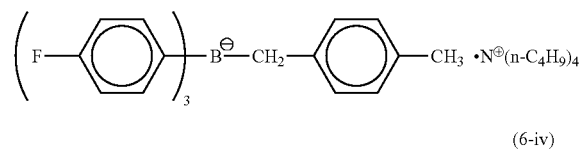
(6-iv)
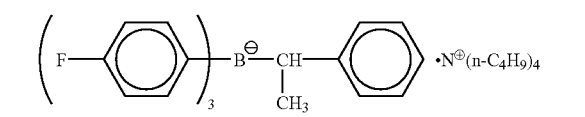
(7)
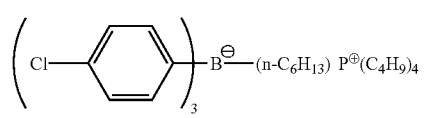
(8)
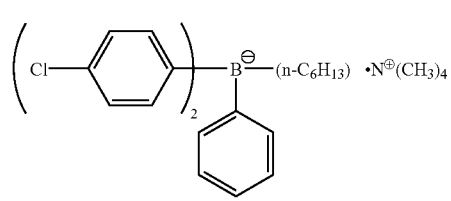
(9)
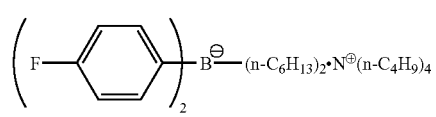
-continued
(10)
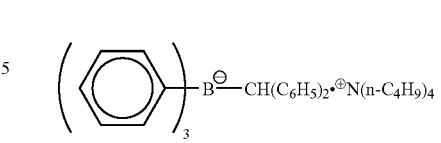
(11)
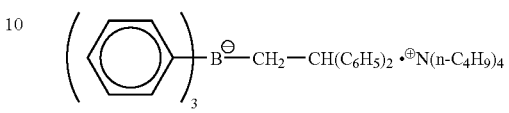
(12)
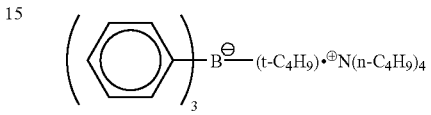
(13)
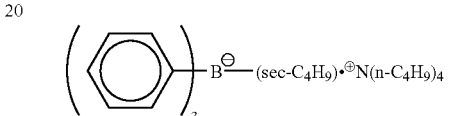
(14)
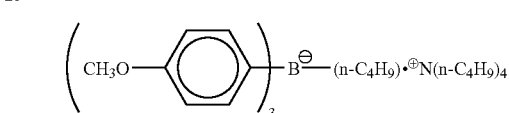
(15)
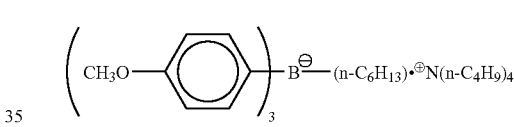
(16)
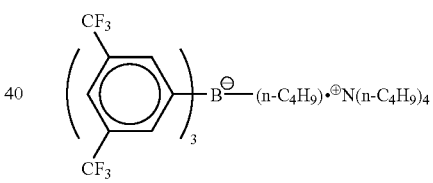
(17)
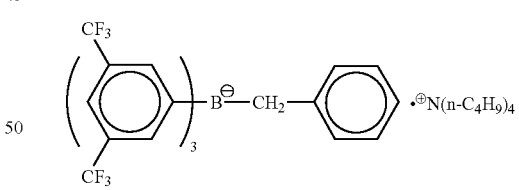
(18)
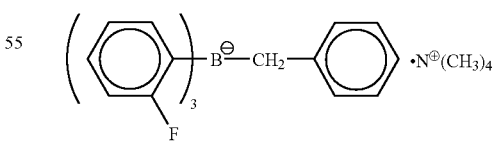
(19)
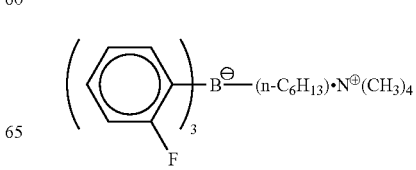

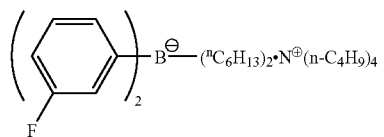
(20)
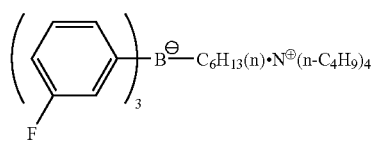
(20-i)
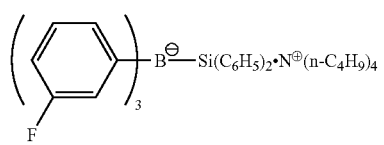
(21)
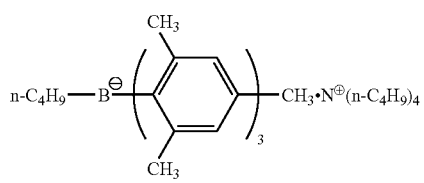
(22)
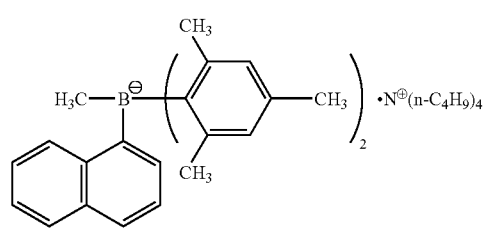
(23)
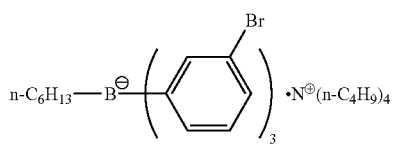
(24)
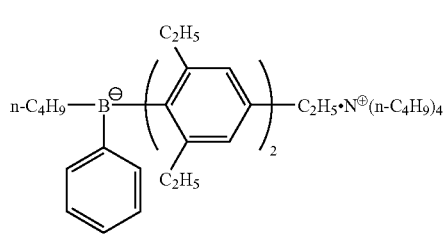
(25)
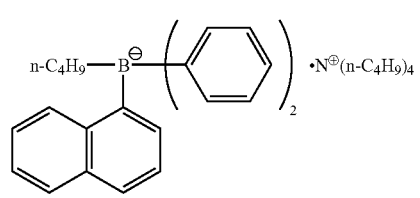
(26)
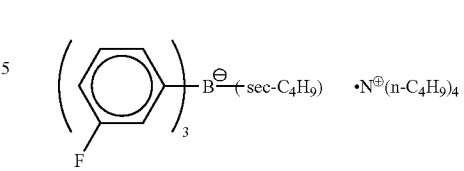
(27)
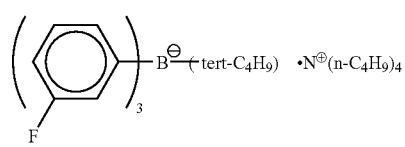
(28)
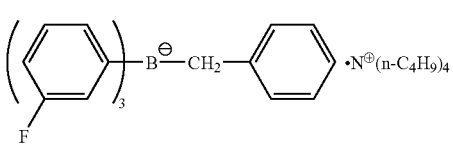
(29)
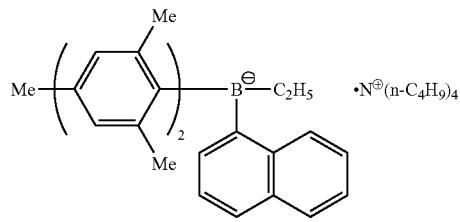
(30)
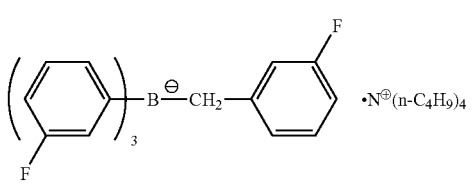
(31)
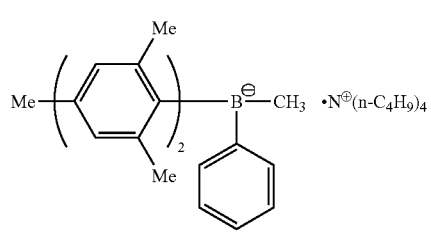
(32)
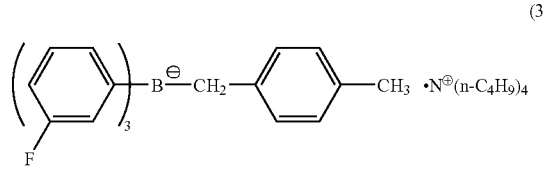
(33)
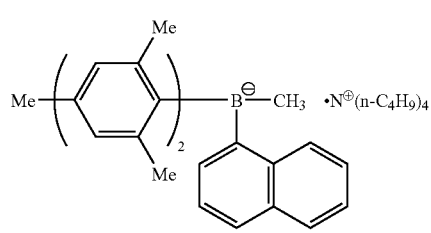
(34)

Chemical Structures

(35)

A structure showing (3-fluorophenyl)(phenyl)borate with CH(CH$_3$) bridge, counterion •N$^{\oplus}$(n-C$_4$H$_9$)$_4$

(36)

Tris(3-fluorophenyl)borate with CH(CH$_3$)-C$_6$H$_4$-OCH$_3$ group, counterion •N$^{\oplus}$(n-C$_4$H$_9$)$_4$

A-1: [(5-F, 2-CH$_3$-phenyl)$_3$B$^-$—CH$_3$] N$^+$(n-C$_4$H$_9$)$_4$

A-2: [(5-F, 2-CH$_3$-phenyl)$_3$B$^-$—C$_2$H$_5$] N$^+$(n-C$_4$H$_9$)$_4$

A-3: [(5-F, 2-CH$_3$-phenyl)$_3$B$^-$—C$_3$H$_7$(n)] N$^+$(n-C$_4$H$_9$)$_4$

A-4: [(5-F, 2-CH$_3$-phenyl)$_3$B$^-$—CH(CH$_3$)C$_2$H$_5$] N$^+$(n-C$_4$H$_9$)$_4$

A-5: [(5-F, 2-CH$_3$-phenyl)$_3$B$^-$—C$_5$H$_{11}$(n)] N$^+$(n-C$_4$H$_9$)$_4$

A-6: [(5-F, 2-CH$_3$-phenyl)$_3$B$^-$—C$_6$H$_{13}$(n)] N$^+$(n-C$_4$H$_9$)$_4$

A-7: [(5-F, 2-CH$_3$-phenyl)$_3$B$^-$—C$_6$H$_{13}$(n)] N$^+$(n-C$_5$H$_{11}$)$_4$

A-8: [(5-F, 2-CH$_3$-phenyl)$_3$B$^-$—C$_6$H$_{13}$(n)] with N$^+$(CH$_3$)$_3$-phenyl counterion

A-9: [(5-F, 2-CH$_3$-phenyl)$_3$B$^-$—C$_6$H$_{13}$(n)] with N$^+$(CH$_3$)$_3$-CH$_2$-phenyl counterion

A-10: [(5-F, 2-CH$_3$-phenyl)$_3$B$^-$—C$_6$H$_{13}$(n)] with N$^+$(CH$_3$)$_3$(CH$_2$CH$_2$OH) counterion

A-11: [(5-F, 2-CH$_3$-phenyl)$_3$B$^-$—C$_6$H$_{13}$(n)] N$^+$(n-C$_8$H$_{17}$)$_4$

A-12: [(5-F, 2-CH$_3$-phenyl)$_3$B$^-$—C$_6$H$_{13}$(n)] with N$^+$(CH$_3$)$_3$(C$_{18}$H$_{37}$) counterion

A-13: {[(5-F, 2-CH$_3$-phenyl)$_3$B$^-$—C$_6$H$_{13}$(n)]}$_2$ with N$^+$(CH$_3$)$_3$—CH$_2$—CH$_2$—N$^+$(CH$_3$)$_3$ counterion

A-14: [(5-F, 2-CH$_3$-phenyl)$_3$B$^-$—C$_6$H$_{13}$(n)] Na$^+$

-continued
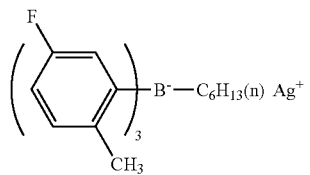 A-15
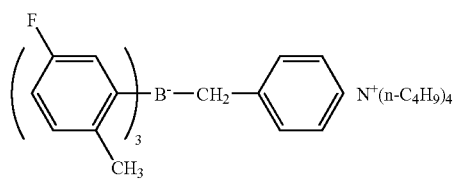 A-16
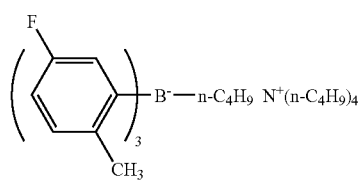 A-17
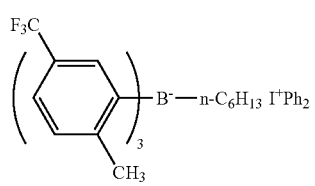 A-18
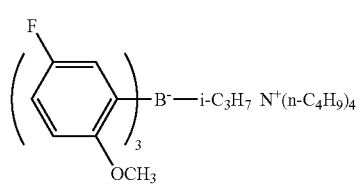 A-19
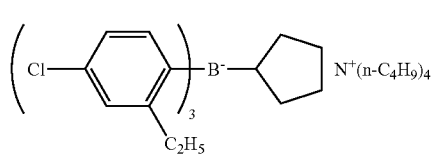 A-20
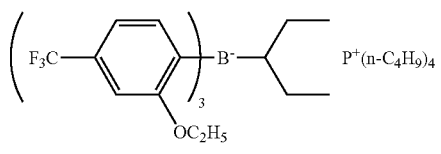 A-21
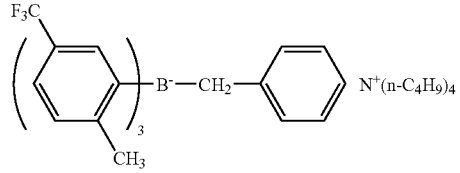 A-22
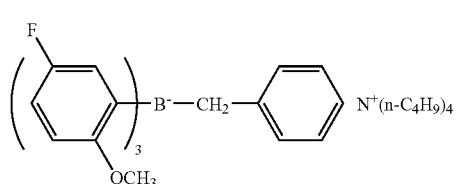 A-23
-continued
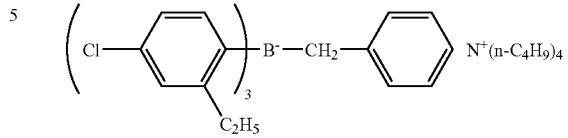 A-24
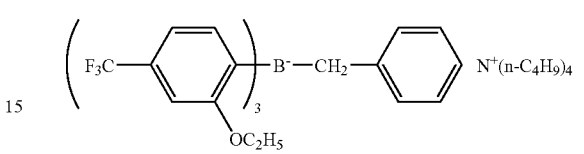 A-25
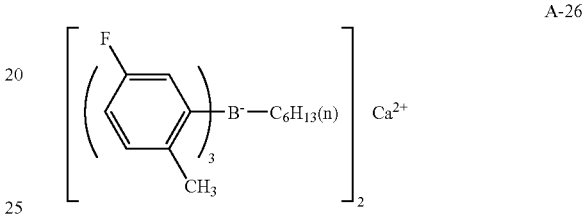 A-26
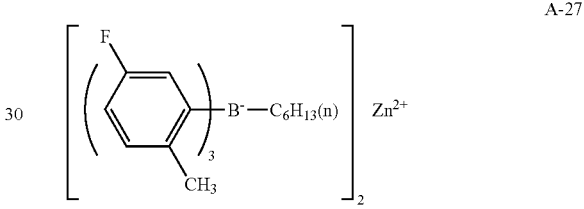 A-27
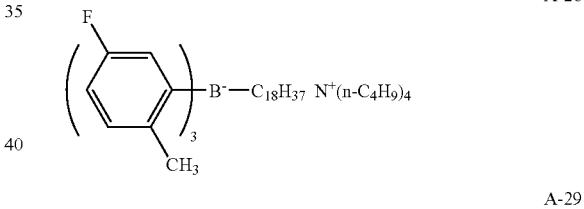 A-28
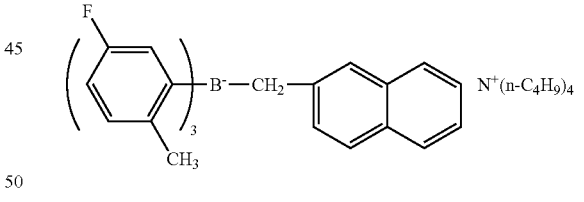 A-29
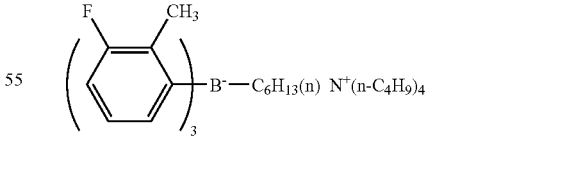 A-30
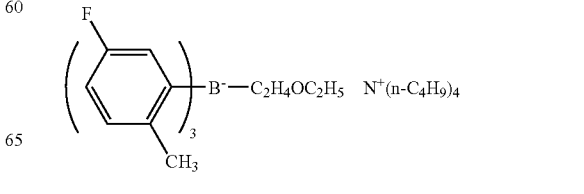 A-31

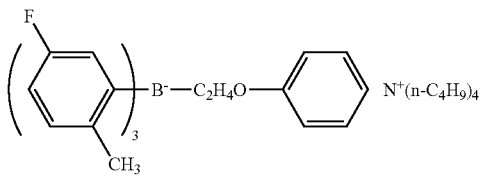
A-32

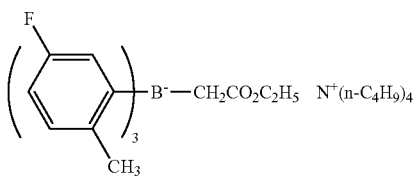
A-33

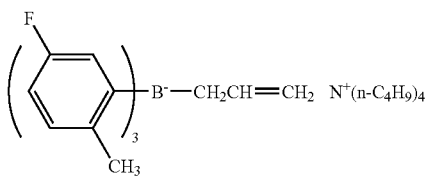
A-34

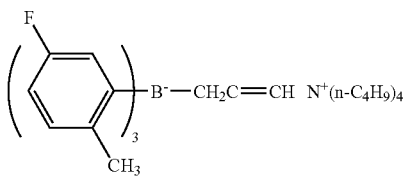
A-35

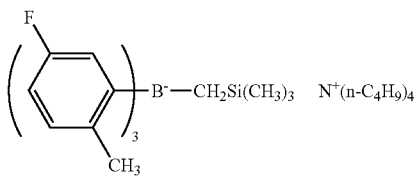
A-36

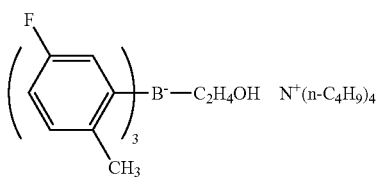
A-37

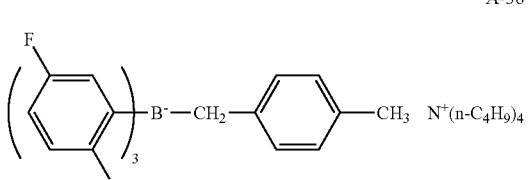
A-38

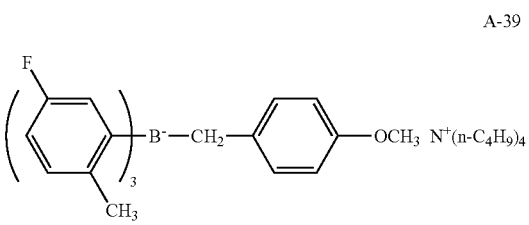
A-39

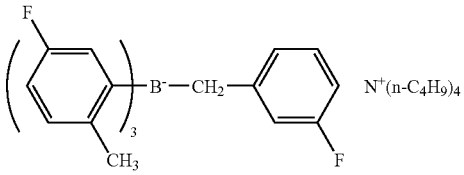
A-40

In so far as the effects of the present invention are not adversely affected, any of the compounds, which are described in Japanese Patent Application No. 11-36308, paragraphs [0145] to [0151], and interact with the organic dyes described above, may be used together with the photopolymerizable composition of the present invention. The compounds, which interact with the organic dyes, are preferably benzoin ethers, s-triazine derivative having a trihalogen-substituted methyl group, organic peroxides, or azinium chlorides.

As an aid that accelerates the polymerization reaction, a reducing agent such as an oxygen scavenger or a chain-transfer aid of an active hydrogen donor, or other compound, which accelerates the polymerization by way of chain transfer, may also be added to the photopolymerizable composition of the present invention.

Examples of the oxygen scavenger include phosphine, phosphonate, phosphite, primary silver salts, and other compounds capable of being easily oxidized by oxygen.

Specific examples of the oxygen scavenger include N-phenylglycine, trimethyl barbituric acid, N,N-dimethyl-2,6-diisopropylaniline, and N,N,N-2,4,6-pentamethyla-nilinic acid. In addition, thiols, thioketones, trihalomethyl compounds, lophine dimer compounds, iodonium salts, sulfonium salts, azinium salts, organic peroxides, azides, and the like are also useful as polymerization accelerators.

(Polymerizable Compound)

The polymerizable compound, which is incorporated in the photopolymerizable composition of the present invention and has an addition-polymerizable unsaturated bond, may be any compound that has an addition-polymerizable unsaturated bond and which can cause the film to harden by polymerization. In the present invention, the polymerizable compound is a compound capable of hardening by a photopolymerization. Examples of the polymerizable compound include a substantially colorless compound having in the molecule thereof a polymerizable group and a site which forms a color by reacting with a color-forming component (this colorless compound is hereinafter referred to as "compound (i)" upon occasion) and a substantially colorless compound having in the molecule thereof a polymerizable group and a site which inhibits the reaction between a color-forming component and another compound (this colorless compound is hereinafter referred to as "compound (ii)" upon occasion).

—Compound (i)—

The substantially colorless compound (i), which is used in the photo- and heat-sensitive recording material and has in the molecule thereof at least one polymerizable group and a site which forms a color by reacting with a color-forming component, may be any compound such as a electron-accepting compound which include a polymerizable group, or a coupler compound which include a polymerizable group, only if the compound has the following two functions. That is, capability to develop a color by reacting with a color-forming component and capability to harden by photopolymerization.

The polymerizable, electron-accepting compound, i.e., a compound having in the molecule thereof an electron-accepting group and a polymerizable group, may be any compound having in the molecule thereof a polymerizable group, and which is capable of developing a color by reacting with an electron-donating, colorless dye as one of the color-forming components and which is capable of hardening the film by photopolymerization.

Examples of the above-mentioned electron-accepting compound include the compounds that can be synthesized by referring to, for example, 3-halo-4-hydroxybenzoic acid described in JP-A No. 4-226455, methacryloxyethyl esters and acryloxyethyl esters of hydroxy-bearing benzoic acid which are described in JP-A No. 63-173682, esters of hydroxy-bearing benzoic acid and hydroxymethylstyrene which are described in JP-A Nos. 59-83693, 60-141587, and 62-99190, hydroxystyrene described in European Patent No. 29323, N-vinylimidazole complexes of zinc halides described in JP-A Nos. 62-167077 and 62-16708, and electron-accepting compounds described in JP-A No. 63-317558.

Among these compounds having in the molecule thereof an electron-accepting group and a polymerizable group, preferable are 3-halo-4-hydroxybenzoic acids represented by the following general formula:

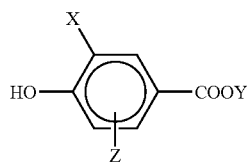

In the formula described above, X represents a halogen atom and preferably a chlorine atom. Y represents a monovalent group having a polymerizable ethenyl group, preferably an aralkyl group having a vinyl group, acryloyloxyalkyl group, or methacryloyloxyalkyl group, and more preferably an acryloyloxyalkyl group having 5 to 11 carbon atoms, or a methacryloyloxyalkyl having 6 to 12 carbon atoms. Z represents a hydrogen atom, an alkyl group, or an alkoxy group.

Examples of the electron-accepting compound having a polymerizable group include the compounds listed as the specific examples of 3-halo-4-hydroxybenzoic acid and others in JP-A No. 11-36308, paragraphs [0082] to [0087].

The electron-accepting compound having a polymerizable group can be used in combination with the electron-donating colorless dye described above.

The amount of the electron-accepting compound to be used is preferably 0.5 to 20 parts by mass, more preferably 1 to 15 parts by mass, most preferably 3 to 10 parts by mass, per part by mass of the electron-donating, colorless dye to be used. If the amount is less than 0.5 parts by mass, sufficient density of developed color may not be obtained, whereas, if the amount exceeds 20 parts by mass, sensitivity may drop or coatability may become inferior.

When the electron-donating, colorless dye and the electron-accepting compound are used as color-forming components, examples of the measures to obtain a desired maximum coloration density include the selection of the kinds of the electron-donating, colorless dye and the electron-accepting compound and the control of the coating weight of the recording layer to be formed.

The coupler compound having the polymerizable group for use in the photo- and heat-sensitive recording layer may be any coupler compound that has the polymerizable group and reacts with a diazonium salt as one of the color-forming components to develop a color and undergoes photopolymerization to harden the film.

The coupler compounds undergo a coupling reaction with a diazo compound to form a dye in a basic environment and/or a neutral environment. According to purposes such as color adjustment, plural kinds of the coupler compounds can be used together.

Examples of the coupler compounds include the compounds listed in JP-A No. 11-36308, paragraphs [0090] to [0096]. However, the coupler compounds for use in the present invention are not limited to these examples.

The amount of the coupler compound to be added in the photo- and heat-sensitive recording layer may be in the range of 0.02 to 5.0 g/m$^2$, preferably in the range of 0.1 to 4 g/m$^2$ and more preferably in the range of 0.5 to 3 g/m$^2$ in view of effectiveness. If the amount to be added is less than 0.02 g/m$^2$, color development is inferior, whereas, if the amount exceeds 5.0 g/m$^2$, coatability of the coating liquid becomes inferior.

The coupler compound can be used in combination with the diazonium salt compound. The amount to be used of the coupler compound is preferably in the range of 0.5 to 20 parts by mass, more preferably in the range of 1 to 10 parts by mass and most preferably in the range of 2 to 7 parts by mass, per part by mass of the diazonium salt compound. If the amount is less than 0.5 parts by mass, color development is inferior, whereas, if the amount exceeds 20 parts by mass, coatability of the coating liquid becomes inferior.

When the diazonium salt compound and the coupler compound are used as color-forming components, in order to obtain a desired maximum coloration density, the kinds of the diazonium salt compound and the coupler compound are selected and the amount of the recording layer to be formed is adjusted.

The coupler compound can be used as a dispersion of solid particles prepared by dispersing the coupler compound in a solid state together with other components in the presence of a water-soluble polymer in a sand mill or the like. The coupler compound can also be used as an emulsion prepared by emulsifying the coupler compound in the presence of a suitable emulsifying aid. The solid-state dispersing process and the emulsifying process are not particularly limited, and methods hitherto known can be employed. The details of these methods are described in JP-A Nos. 59-190886, 2-141279, and 7-17145.

In the present invention, in order to accelerate the coupling reaction, an organic base, such as a tertiary amine, a piperizine, a piperazine, an amidine, a formamidine, a pyridine, a guanidine, a morpholine, or the like, can be used.

More specifically, these organic bases are described in JP-A Nos. 57-123086, 60-49991, 60-94381, 9-71048, 9-77729 and 9-77737.

The amount of the organic base to be used is not particularly limited, but it is preferable to use the organic base in an amount falling within a range of 1 to 30 moles per mole of the diazonium salt.

A color development aid can be added in order to accelerate the color-forming reaction.

Examples of the color development aid include phenol derivatives, naphthol derivatives, alkoxy-substituted benzenes, alkoxy-substituted naphthalenes, hydroxy compounds, carboxylic acid amides, sulfonamide compounds, and so on.

Presumably because these compounds lower the melting points of the coupler compounds or the basic compounds or increase the thermal permeability through the capsule wall, a higher density of developed color is obtained.

—Compound (ii)—

Depending on the compounds to be used, a suitable compound, i.e., a specific photopolymerizable monomer ($D^1$ or $D^2$) is selected and used as the compound (ii). In the case where a substantially colorless compound, which has no polymerizable group and reacts with a color-forming component to develop a color, is used, since this compound has no polymerizable group and a function to harden the film by photopolymerization needs to be imparted to the recording layer, a substantially colorless compound (ii), which has in the molecule thereof at least one polymerizable group and a site designed to inhibit the reaction between a color-forming component and other compound, is used together.

The substantially colorless compound, which has no polymerizable group and reacts with a color-forming component to develop a color, may be any electron-accepting compound or coupler compound having in the molecule thereof no polymerizable group. The electron-accepting compound having in the molecule thereof no polymerizable group may be any compound capable of developing a color by reacting with an electron-donating, colorless dye as one of the color-forming components.

When an electron-accepting compound having no polymerizable group is used, a specific photopolymerizable monomer $D^1$ is used also. The photopolymerizable monomer $D^1$ is preferably a photopolymerizable monomer having a function to inhibit the reaction between the electron-donating, colorless dye and the electron-accepting compound and having in the molecule thereof at least one vinyl group.

Specific examples of the photopolymerizable monomer $D^1$ include acrylic acid and salts thereof, acrylic esters, and acrylamides; methacrylic acid and salts thereof, methacrylic esters, and methacrylamides; maleic anhydride and maleic esters; itaconic acid and itaconic esters; styrenes; vinyl ethers; vinyl esters; N-vinyl heterocycles; allyl ethers and ally esters, and so on.

Among these monomers, compounds having in the molecule thereof a plurality of vinyl groups are preferable. Specifically, preferable are acrylic acid or methacrylic acid esters of polyhydric alcohols such as trimethylolpropane and pentaerythritol; acrylic acid or methacrylic acid esters of polyhydric phenols and bisphenols such as resorcinol, pyrogallol, and fluoroglucinol; acrylate- or methacrylate-terminated epoxy resins; and acrylate- or methacrylate-terminated polyesters.

Among these compounds, particularly preferable are ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate, and diethylene glycol dimethacrylate.

The molecular weight of the photopolymerizable monomer $D^1$ is preferably about 100 to about 5000, more preferably about 200 to about 4000 and most preferably about 300 to about 2000.

The amount of the photopolymerizable monomer $D^1$ to be used is preferably in the range of 0.1 to 10 parts by mass, more preferably in the range of 0.3 to 7 parts by mass and most preferably in the range of 0.5 to 5 parts by mass, per part by mass of the substantially colorless compound which reacts with the color-forming component to develop a color. If the amount is less than 0.1 parts by mass, latent images cannot be formed in the exposing step, whereas, if the amount exceeds 10 parts by mass, the density of developed color undesirably drops.

When the coupler compound having no polymerizable group is used, a specific photopolymerizable monomer $D^2$ is used together. The photopolymerizable monomer $D^2$ is preferably a photopolymerizable monomer which has in the molecule thereof an acidic group capable of inhibiting the coupling reaction and is not a metal salt compound.

Examples of the photopolymerizable monomer $D^2$ include the compounds described in JP-A No. 11-36308, paragraphs [0128] to [0130].

The amount of the photopolymerizable monomer $D^2$ to be used is preferably in the range of 0.1 to 10 parts by mass, more preferably in the range of 0.3 to 7 parts by mass and most preferably in the range of 0.5 to 5 parts by mass, per part by mass of the substantially colorless compound which reacts with the color-forming component to develop a color. If the amount is less than 0.1 parts by mass, latent images cannot be formed in the exposing step, whereas, if the amount exceeds 10 parts by mass, the density of developed color undesirably drops.

<Recording Material>

Next, the recording material of the present invention is explained. The recording material of the present invention is a recording material comprising a support having a recording layer formed on the support wherein the recording layer contains the photopolymerizable composition of the present invention. The basic constructions of the recording material include the constructions corresponding to those of the recording materials (a) to (c) described previously. The constituent components for use in the recording material of the present invention are described in detail below.

Examples of the color-forming component A to be included in microcapsules include an electron-donating, colorless dye, which is substantially colorless, and a diazonium salt compound.

The electron-donating, colorless dye may be any conventionally known one with the proviso that the dye reacts with the compound B, compound C, or compound E to develop a color.

Specific examples of these color-forming components include those described in Japanese Patent Application No. 11-36308. For example, electron-donating compounds are described in paragraphs [0051] to [0059] of the same patent literature. Electron-donating, colorless dyes, which develop cyan, magenta, and yellow colors and are used in combination with the electron-donating compounds when the recording material of the present invention is used as a multicolor recording material, are described in paragraph [0060] of the same patent literature.

The amount of the electron-donating, colorless dye to be used in the photo- and heat-sensitive recording layer is preferably in the range of 0.1 to 1 $g/m^2$, more preferably 0.1 to 0.7 $g/m^2$ and most preferably 0.1 to 0.5 $g/m^2$. If the amount is less than 0.1 $g/m^2$, sufficient density of developed color is not obtained, whereas, if the amount exceeds 1 $g/m^2$, coatability of the coating liquid becomes inferior.

In the case of a multilayer recording material, the recording layer is formed by lamination of plural recording layers each containing the electron-donating, colorless dye in an amount described above. Each of plural recording layers is adopted for producing a different color. However, as occasion demands, some of plural recording layers may be adopted for producing a same color.

An example of the diazonium salt compound is a compound represented by the following formula:

where Ar represents an aryl group and X⁻ represents an acid anion.

The diazonium salt compound is a compound that undergoes a coupling reaction with a coupler to develop a color when heated or undergoes decomposition by light. The maximum absorption wavelength can be controlled by the position or kind of the substituent in the Ar portion.

In the general formula described above, Ar represents a substituted or unsubstituted aryl group. The substituents and the aryl groups may be those described in Japanese Patent Application No. 11-36308, paragraphs [0064] to [0067].

From the standpoint of effects, the maximum absorption wavelength $\lambda_{max}$ of the diazonium salt compound is preferably 450 nm or less and more preferably 290 to 440 nm. In addition, it is desirable that the diazonium compound for use in the present invention has 12 or more carbon atoms and has a solubility in water of 1% or less and a solubility in ethyl acetate of 5% or more.

Specific examples of the diazonium salt compound suitable for use in the present invention include the diazonium compounds described in Japanese Patent Application No. 11-36308, paragraphs [0064] to [0075]. However, the diazonium salt compounds suitable for use in the present invention are not limited to these examples.

In the present invention, the diazonium salt compounds may be used singly or in combinations of two or more kinds depending on such purposes as color adjustment.

The amount of the diazonium salt compound to be used in the photo- and heat-sensitive recording layer is preferably in the range of 0.01 to 3 g/m², and more preferably 0.02 to 2.0 g/m² and most preferably 0.02 to 1.0 g/m². If the amount is less than 0.01 g/m², sufficient density of developed color is not obtained, whereas, if the amount exceeds 3 g/m², sensitivity undesirably drops and the time required for fixing become longer.

The substantially colorless compound B, which is to be used in the photo- and heat-sensitive recording layer and has in the molecule thereof a polymerizable group and a site that reacts with the color-forming component A to develop a color, may be the same as the compound (i). The substantially colorless compound B may be any compound, such as electron-accepting compound having a polymerizable group or a coupler compound having a polymerizable group, which has the two functions, i.e., developing a color by reacting with the color-forming component A and hardening by photopolymerization.

In the present invention, a substantially colorless compound C, which has no polymerizable group and reacts with the color-forming component A to develop a color, can also be used as a compound which reacts with the color-forming component A to develop a color in place of the compound B having a polymerizable group.

However, since the compound C has no polymerizable group and it is necessary to impart a function of hardening the film by photopolymerization to the recording layer, a compound D having a polymerizable group needs to be used together with the compound C. Depending on the compound C to be used, a suitable compound D (i.e., the photopolymerizable monomer $D^1$ or $D^2$) is selected and used.

The compound C may be any electron-accepting compound having no polymerizable group or any coupler compound having no polymerizable group.

The electron-accepting compound having no polymerizable group may be any one that develops a color by reacting with the electron-donating, colorless dye as one of the color-forming components A.

Examples of the electron-accepting compound having no polymerizable group include a phenol derivative, a salicylic acid derivative, a metal salt of an aromatic carboxylic acid, acid clay, bentonite, a novolak resin, a metal-treated novolak resin, a metal complex, and the like.

Specific examples thereof are described in, for example, JP-B Nos. 40-9309 and 45-14039, and JP-A Nos. 52-140483, 48-51510, 57-210886, 58-87089, 59-11286, 60-176795, and 61-95988.

Specific examples of these compounds include those described in Japanese Patent Application No. 11-36308, paragraphs [0109] to [0110].

When the electron-accepting compound having no polymerizable group is used, the amount of the electron-accepting compound having no polymerizable group to be used is preferably in the range of 5 to 1000% by mass based on the amount of the electron-donating, colorless dye to be used.

When the electron-accepting compound having no polymerizable group is used, the compound D, i.e., a specific photopolymerizable monomer $D^1$, is used together. The specific photopolymerizable monomer $D^1$ is as described previously.

The coupler compound having no polymerizable group may be any one that develops a color by reacting with the diazonium salt compound as one of the color-forming components A.

The coupler compound having no polymerizable group undergoes a coupling reaction with a diazonium salt compound to develop a dye in a basic atmosphere and/or a neutral atmosphere. Plural kinds of these coupler compounds may be used together depending on such purposes as color adjustment.

Examples of the coupler compound having no polymerizable group include a so-called active methylene compound having a methylene group adjacent to a carbonyl group, a phenol derivative, and a naphthol derivative. These compounds can be selected and used in the present invention in so far as these compounds do not contravene the objectives of the present invention.

Specific examples of the compound having no polymerizable group include those described in Japanese Patent Application No. 11-36308, paragraphs [0119] to [0121].

The details of the coupler compound having no polymerizable group are described, for example, in JP-A Nos. 4-201483, 7-223367, 7-223368, 7-323660, 5-278608, 5-297024, 6-18669, 6-18670, and 7-316280. In addition, reference can be made to the compounds described in the specifications filed by the present applicant, such as Japanese Patent Application Nos. 8-12610 and 8-30799, and JP-A Nos. 9-216468, 9-216469, 9-319025, 10-35113, 10-193801, and 10-264532.

As in the case of the coupler compound having a polymerizable group, the amount of the coupler compound having no polymerizable group to be used in the photo- and heat-sensitive recording layer is preferably in the range of 0.02 to 5 g/m², more preferably 0.1 to 4 g/m² and most preferably 0.5 to 3 g/m² from the standpoint of effectiveness. If the amount is less than 0.02 g/m², sufficient density of developed color is not obtained, whereas, if the amount exceeds 5 g/m², coatability of the coating liquid becomes inferior.

The coupler compound can be used as a dispersion of solid particles prepared by dispersing the coupler compound together with other components in the presence of a water-soluble polymer in a sand mill or the like. The coupler compound can also be used as an emulsion prepared by emulsifying the coupler compound in the presence of a suitable emulsification aid. The solid-state dispersing method and the emulsifying method are not particularly limited, and methods hitherto known can be employed. The details of these methods are described in JP-A Nos. 59-190886, 2-141279, and 7-17145.

In the present invention, in order to accelerate the coupling reaction, an organic base, such as tertiary amines, piperizines, piperazines, amidines, formamidines, pyridines, guanidines, morpholines, or the like, can be used.

Examples of the organic bases for use in the present invention include the same organic bases as those to be used in the case of the coupler compound having a polymerizable group. The same applies to the amounts of the organic bases that can be used in the present invention.

The color-developing aid, which is used for the acceleration of the color-developing reaction, maybe the same as the color-developing aid for use in the case of the coupler compound having a polymerizable group.

When the coupler compound having no polymerizable group is used, the compound D, i.e., a specific photopolymerizable monomer $D^2$, is used also. The photopolymerizable monomer $D^2$ is as described previously.

The substantially colorless compound E, which is used in the photo- and pressure-sensitive recording layer and reacts with the color-forming component A to develop a color, may be any one that reacts with the color-forming component A to develop a color and may or may not have a polymerizable group. For example, as described above, the substantially colorless compound E may be the same as the compound B having a polymerizable group or the same as the electron-accepting compound or the coupler compound listed as the compound C having no polymerizable group.

Without being limited to the photo- and heat-sensitive recording materials (a) to (c), the recording material of the present invention may have various constructions according to the purposes described previously.

(Protective Layer)

When necessary, a protective layer may be provided on the recording material of the present invention. The protective layer may be provided as an outermost layer. Preferably, the protective layer is provided on the outermost layer on the side of incidence of the light for irradiation of a multicolor, multilayer recording material.

The protective layer may have a single-layer construction or may have a laminated construction consisting of two or more layers.

Examples of the material for use in the protective layer include water-soluble polymeric compounds such as polyvinyl alcohol, carboxy-modified polyvinyl alcohol, vinyl acetate/acrylamide copolymers, silicon-modified polyvinyl alcohol, starch, modified starch, methyl cellulose, carboxymethyl cellulose, hydroxymethyl cellulose, gelatins, gum arabic, casein, hydrolysates of styrene/maleic acid copolymers, hydrolysates of half esters of styrene/maleic acid copolymers, hydrolysates of isobutylene/maleic anhydride copolymers, polyacrylamide derivatives, polyvinyl pyrrolidone, polystyrenesulfonic acid sodium salts, and sodium alginate; and latices such as styrene/butadiene rubber latices, acrylonitrile/butadiene rubber latices, methyl acrylate/butadiene rubber latices, and vinyl acetate emulsions.

The water-soluble polymeric compounds in the protective layer may be crosslinked so that the storability is further enhanced. The crosslinking agent may be a conventionally known one. Specific examples of the crosslinking agent include water-soluble, initial-stage condensation products such as N-methylol urea, N-methylol melamine, and urea/formalin; dialdehyde compounds such as glyoxal, and glutaraldehyde; inorganic crosslinking agents such as boric acid and borax; and polyamideepichlorohydrin.

The protective layer may contain a conventionally known pigment, metal soap, wax, surfactant, etc. The protective layer may also contain a conventionally known UV absorbing agent or a precursor of a UV absorbing agent.

The coating weight of the protective layer is preferably 0.2 to 5 g/m², more preferably 0.3 to 4 g/m² and most preferably 0.5 to 3 g/m².

(Multicolor Recording Material)

The recording layer of the present invention may be a multicolor multilayer recording layer formed by lamination of layers, each of which is adopted for producing a different color. That is, a multicolor recording material can be prepared by laminating onto a support a plurality of single-color recording layers wherein each recording layer contains microcapsule enclosing a color-forming component forming a different color and a photopolymerizable composition sensitive to light of a different wavelength from one another. The photopolymerizable composition can be made into a photopolymerizable composition sensitive to a different wavelength by use of an organic dye or other spectral sensitizing compound having a different absorption wavelength. In this case, an intermediate layer may be provided between the photo- and heat-sensitive recording layers producing different colors.

For example, the photo- and heat-sensitive recording layer or photo- and pressure-sensitive recording layer of the multicolor, multilayer of the recording material of the present invention can be obtained in the following way.

That is, the photo- and heat-sensitive recording layer or photo- and pressure-sensitive recording layer has a laminated structure produced by providing on a support a first recording layer which contains microcapsules containing a color-forming component for developing a yellow color and a photopolymerizable composition sensitive to a light source having a central wavelength of $\lambda_1$, providing on the first recording layer a second recording layer which contains microcapsules containing a color-forming component for developing a magenta color and a photopolymerizable composition sensitive to a light source having a central wavelength of $\lambda_2$, and providing on the second recording layer a third recording layer which contains microcapsules containing a color-forming component for developing a cyan color and a photopolymerizable composition sensitive to a light source having a central wavelength of $\lambda_3$. In addition, if necessary, the recording layer may have a protective layer or may have an intermediate layer between the recording layers. The above-mentioned central wavelengths $\lambda_1$, $\lambda_2$, and $\lambda_3$ of the light sources differ from each other.

The laminated structure of the photo- and heat-sensitive recording layer or photo- and pressure-sensitive recording layer of the present invention may have any number of the recording layer. Preferably, the recording layer may contain first to i th layers, each layer is sensitive to light having a central wavelength different from the light having a central wavelength to which other layers are sensitive, and each layer develops a color different from that of other layers. For example, the first recording layer is sensitive to light having a central wavelength of $\lambda_1$ and develop a color, a second recording layer is sensitive to light having a central wavelength of $\lambda_2$ and develops a color different from the color of the first recording layer, and an i th recording layer is sensitive to light having a central wavelength of $\lambda_i$ and develops a color different from the colors of i–1 th recording layer. The layers are laminated in a direction of thickness of the multilayer recording layer from the support on which recording light is incident. When the construction of the laminated structure is used in the present invention, i is preferably any integer selected from 1 to 10, more preferably any integer selected from 2 to 6, and most preferably any integer selected from 2 to 4.

When images are formed using a recording material having a multicolor recording layer like the one for use in the present invention, the exposure step consists of image-wise exposure using plural light sources whose wavelengths match the absorption wavelengths of the recording layers, respectively, and are different from each other. This exposure enables the recording layers whose absorption wavelengths match the wavelengths of the respective light sources to form latent images selectively. Because of this, multicolor images can be formed with a high sensitivity and in high sharpness. Furthermore, since the background, which is colored with such compounds as a spectral sensitizing compound and a photopolymerization initiator, can be decolorized by irradiating the recording layer surface with light, high-quality images having a high contrast can be formed.

In the recording material of the present invention, the recording material uses the electron-donating, colorless dye or diazonium salt compound that is used (these are hereinafter referred to as "color-forming components" upon occasion) in a state in which they are encapsulated in microcapsules. For the encapsulation, a conventionally known method can be employed.

Examples of the method include a method utilizing coacervation of a hydrophilic wall-forming material described in U.S. Pat. Nos. 2,800,457 and 2,800,458; an interfacial polymerization method described in U.S. Pat. No. 3,287,154, U. K. Patent No. 990,443, and JP-B Nos. 38-19574, 42-446, and 42-771; a method utilizing polymer deposition described in U.S. Pat. Nos. 3,418,250 and 3,660,304; a method utilizing an isocyanate-polyol wall forming material described in U.S. Pat. No. 3,796,669; a method utilizing an isocyanate wall forming material described in U.S. Pat. No. 3,914,511; a method utilizing urea-formaldehyde and urea-formaldehyde-resorcinol wall-forming materials described in U.S. Pat. Nos. 4,001,140, 4,087,376, and 4,089,802; a method utilizing wall-forming materials such as a melamine-formaldehyde resin and hydroxypropylcellulose described in U.S. Pat. No. 4,025,455; an in-situ method utilizing a polymerization of monomers described in JP-B No. 36-9168 and JP-A No. 51-9079; a method utilizing electrolytic dispersion cooling described in U. K. Patent Nos. 952,807 and 965,074; and a spray-drying method described in U.S. Pat. No. 3,111,407 and U. K. Patent No. 930,442.

The encapsulating method is not limited to the methods listed above. However, in the recording material of the present invention, it is particularly preferable to employ an interfacial polymerization method comprising the steps of mixing an oil phase, prepared by dissolving or dispersing the color-forming component in a hydrophobic organic solvent that becomes the core of the capsules, and an aqueous phase having a water-soluble polymer dissolved therein, emulsifying the mixture by means of a homogenizer or the like, and heating the emulsion so as to cause a polymer-forming reaction at the interface of droplets so that polymeric microcapsule walls are formed.

This method makes it possible to form capsules having uniform particle diameters in a short period of time and to obtain a recording material excellent in storability as a raw recording material.

The reactants that form the polymer are added to the inside of the droplets and/or the outside of the droplets. Examples of the polymeric substance include polyurethane, polyurea, polyamide, polyester, polycarbonate, urea/formaldehyde resins, melamine resins, polystyrene, styrene/methacrylate copolymers, styrene/acrylate copolymers, and so on. Among these substances, polyurethane, polyurea, polyamide, polyester, and polycarbonate are preferable, and polyurethane and polyurea are particularly preferable. The above-listed polymeric substances may be used in combinations of two or more kinds.

Examples of the water-soluble polymers include gelatin, polyvinyl pyrrolidone, polyvinyl alcohol, and so on.

For example, when polyurethane is used as a capsule wall material, the microcapsule wall can be formed by mixing a polyvalent isocyanate and a second substance (e.g., polyol or polyamine) that reacts therewith to form the capsule wall in a water-soluble polymer aqueous solution (i.e., aqueous phase) or in an oily medium (oil phase) to be encapsulated, emulsifying the mixture, and heating the resulting emulsion so as to cause a polymer-forming reaction at the interface of droplets.

As the polyvalent isocyanate and the polyol or polyamine, with which the polyvalent isocyanate reacts, those which are described in U.S. Pat. Nos. 3,281,383, 3,773,695, and 3,793,268, and JP-B Nos. 48-40347 and 49-24159, and JP-A Nos. 48-80191 and 48-84086 can be used.

When microcapsules containing the color-forming component are prepared, the color-forming component to be enclosed in the microcapsules may be present in a state of a solution or may be present in a state of a solid inside the microcapsules.

The solvent to be used may be the same solvent as the one to be used for the emulsifying dispersion of the photopolymerizable composition described previously.

When enclosing the electron-donating, colorless dye or diazonium salt compound in a state of a solution inside the microcapsules, the electron-donating, colorless dye or diazonium salt compound, which is dissolved in a solvent, may be encapsulated. The amount of the organic solvent to be used is preferably in the range of 1 to 500 parts by mass per 100 parts by mass of the electron-donating, colorless dye.

When the electron-donating, colorless dye or diazonium salt compound to be encapsulated has a poor solubility in the organic solvent, a low-boiling solvent having a high solvency may be used as an auxiliary solvent. Examples of the low-boiling solvent include ethyl acetate, propyl acetate, isopropyl acetate, butyl acetate, methylene chloride, and so on.

An aqueous solution having a water-soluble polymer dissolved therein is used as the aqueous phase. The oil phase described above is added to the aqueous phase and thereafter the mixture is emulsified by means of a homogenizer or the like. The water-soluble polymer acts as a dispersing medium which enables uniform and easy dispersion and stabilizes the aqueous dispersion thus obtained. In this case, in order to obtain a further uniform and stable dispersion, a surfactant may be added to at least one of the oil phase and the aqueous phase. As the surfactant, a conventionally known surfactant for emulsification may be used. When the surfactant is added, the amount of the surfactant to be added is preferably 0.1 to 5% by mass, more preferably 0.3 to 3% by mass and particularly preferably 0.5 to 2% by mass, based on the mass of the oil phase.

The surfactant to be incorporated in the aqueous phase can be suitably selected from anionic or nonionic surfactants that do not cause precipitation or flocculation by interacting with the protective colloids.

Preferred examples of the surfactant include sodium alkylbenzenesulfonate, sodium alkylsulfate, sodium dioctylsulfosuccinate, and polyalkylene glycol (e.g., polyoxyethylene nonylphenyl ether).

As stated above, the water-soluble polymer, which is present as protective colloids in the aqueous phase to be mixed with the oil phase, may be selected appropriately from conventionally known anionic polymers, nonionic polymers, and amphoteric polymers.

Examples of the anionic polymer that can be used include natural ones and synthetic ones. Some examples are polymers having such groups as —COO—, —$SO_2$—, and the like.

Specific examples thereof include naturally occurring substances such as gum arabic, alginic acid, and pectin; semisynthetic products such as carboxymethyl cellulose, gelatin derivatives, e.g., phthalated gelatin, sulfated starch, sulfated cellulose, and ligninsulfonic acid; and synthetic products such as maleic anhydride-based (including hydrolysate) copolymers, acrylic acid-based (including methacrylic acid-based) polymers and copolymers, vinylbenzenesulfonic acid-based polymers and copolymers, and carboxy-modified polyvinyl alcohol.

Examples of the nonionic polymer include polyvinyl alcohol, hydroxyethyl cellulose, and methyl cellulose.

Examples of the amphoteric polymer include gelatin and the like. Among these polymers, gelatin, gelatin derivatives, and polyvinyl alcohol are preferable.

The water-soluble polymers are used as 0.01 to 10% by mass solutions.

All of the components including the color-forming components to be incorporated in the recording layer of the present invention can be dispersed in solid states by such means as a sand mill together with a water-soluble polymer, a sensitizer, and other color-forming aid. But, it is preferable to employ a process comprising the steps of dissolving these components in an organic solvent having a high boiling point, which is difficultly soluble or insoluble in water, blending the resulting solution with a polymer aqueous solution (i.e., aqueous phase) containing a surfactant and/or water soluble-polymer as protective colloids, and emulsifying the blend by such means as a homogenizer so as to obtain an emulsified dispersion for use. In this process, if necessary, a solvent having a low boiling point may be used as an auxiliary solvent.

All of the components including the color-forming components may be separately emulsified or may be emulsified after the blend thereof is dissolved in an organic solvent having a high boiling point. The particle diameter of the emulsified dispersion is preferably 1 µm or less.

The emulsification of the oil phase containing the components described above and the aqueous phase containing protective colloids and a surfactant can be easily carried out by a conventionally known means such as a high-speed stirring means or an ultrasonic dispersing means which is used for obtaining fine emulsified particles. Examples of the emulsifying apparatus are a homogenizer, a menton gorille, a dissolver, a keddy mill, etc.

After being emulsified, the emulsified dispersion is heated to a temperature of 30 to 70° C. so as to accelerate the capsule wall-forming reaction. During the reaction, in order to prevent the flocculation of capsules, it is necessary to add water to reduce the probability of the collision of capsules or to stir the emulsified dispersion sufficiently.

It is also possible to add a dispersion designed for the prevention of the flocculation to the emulsified dispersion during the reaction. Since the generation of carbon dioxide gas is observed as the polymerization reaction proceeds, the point of time when the gas generation ceases can be regarded as the termination of the capsule wall-forming reaction. Ordinarily, after carrying out the reaction for several hours, the microcapsules, which enclose the dye and are aimed at, can be obtained.

The average particle diameter of the microcapsules for use in the recording material of the present invention is preferably 20 µm or less, more preferably 10 µm or less and most preferably 5 µm or less from the standpoint of obtaining high resolution. The average particle diameter is preferably 0.1 µm or greater because, if the average particle diameter of the microcapsules is too small, the surface area per unit amount of the solid components becomes larger and a lager amount of wall-forming materials is required.

When the recording material of the present invention is used as a multicolor recording material, the photo- and heat-sensitive recording layer or the photo- and pressure-sensitive recording layer of the recording material comprises a support having plural recording layers laminated thereon wherein each layer contains microcapsules containing an electron-donating, colorless dye or a diazonium salt compound designed to develop a different color and a photopolymerizable composition containing an organic dye or other spectral sensitizing compound having a different maximum absorption wavelength. If the recording material is irradiated with light, the different wavelengths of the light sources sensitize the recording layers of the recording material so that a multicolor image is formed.

(Intermediate Layer)

An intermediate layer can be provided between the single-color recording layers constituting the photo- and heat-sensitive recording layer or photo- and pressure-sensitive recording layer. The intermediate layer is composed mainly of a binder. If necessary, the intermediate layer may contain additives such as a hardener, a polymer latex, etc.

In the recording material of the present invention, the binder, which is to be used in various layers such as a protective layer, a photo- and heat-sensitive recording layer, a photo- and pressure-sensitive recording layer, and an intermediate layer, may be the same substance as the binder to be used in the emulsification of the photopolymerizable composition described above or the water-soluble polymer to be used for the encapsulation of the color-forming components. In addition, examples of the substance that can be used as the binder include solvent-soluble polymers such as polystyrene, polyvinyl formal, polyvinyl butyral, acrylic resins, e.g., polymethyl acrylate, polybutyl acrylate, polymethyl methacrylate, polybutyl methacrylate, and copolymers thereof, phenol resins, styrene-butadiene resins, ethyl cellulose, epoxy resins, and urethane resins, and latices of such polymers.

Among these substances, gelatin and polyvinyl alcohol are preferable.

(Others)

The recording layers constituting the recording material of the present invention may contain various surfactants for such purposes as a coating aid, an antistatic agent, an agent to improve sliding properties, an emulsifier, an adhesion inhibitor.

Examples of the surfactant that can be used include nonionic surfactants such as saponin, polyethylene oxide, and polyethylene oxide derivatives, e.g., alkyl ethers of polyethylene oxide; anionic surfactants such as alkylsulfonates, alkylbenzenesulfonates, alkylnaphthalenesulfonates, alkylsulfuric esters, N-acyl-N-alkyltaurines, sulfosuccinic esters, and sulfoalkylpolyoxyethylene alkylphenyl ethers; amphoteric surfactants such as alkylbetaines and alkylsulfobetaines; and cationic surfactants such as aliphatic or aromatic quaternary ammonium salts.

Furthermore, if necessary, the recording layer may contain additives other than those described above.

For example, the recording layer may contain a dye, an ultraviolet absorbing agent, a plasticizer, a fluorescent brightener, a matting agent, a coating aid, a hardener, an antistatic agent, a sliding property-improving agent, etc, Typical examples of these additives are described in Research Disclosure, Vol. 176 (1978, December, Item 17643) and Research Disclosure, Vol.187 (1979, November, Item 18716).

According to the recording material of the present invention, the photo- and heat-sensitive recording layer, the photo- and pressure-sensitive recording layer, the intermediate layer, and the protective layer may each contain a hardener, if necessary.

In particular, it is preferable that the protective layer contains a hardener so that the adhesiveness of the protective layer diminishes. As the hardener, for example, a "gelatin hardener", which is used in the preparation of a photographic photosensitive material, is useful. Examples of the hardeners that can be used are aldehyde-based compounds such as formaldehyde and glutaraldehyde; reactive halogen compounds described, for example, in U.S. Pat. No. 3,635,718; compounds having a reactive ethylenically unsaturated group described, for example, in U.S. Pat. No. 3,635,718; aziridine-based compounds described, for example, in U.S. Pat. No. 3,017,280; epoxy-based compounds, halogenocarboxyaldehydes such as mucochloric acid, and dioxanes such as dihydroxydioxane and dichlorodioxane described, for example, in U.S. Pat. No. 3,091,537; vinylsulfones described in U.S. Pat. Nos. 3,642,486 and 3,687,707; vinylsulfone precursors described in U.S. Pat. No. 3,841,872; and vinylketones described in U.S. Pat. No. 3,640,720. In addition, inorganic hardeners such as chrome alum, zirconium sulfate, boric acid, etc. can also be used.

Among these compounds, preferable are 1,3,5-triacryloyl-hexahydro-s-triazine, 1,2-bisvinylsulfonylmethane, 1,3-bis(vinylsulfonylmethyl)propanol-2, bis(α-vinylsufonylacetamide)ethane, 2,4-dichloro-6-hydroxy-s-triazine sodium salt, 2,4,6-triethylenimino-s-triazine, boric acid, etc.

It is preferable that the hardener is added in an amount falling within the range of 0.5 to 5% by mass based on the amount of the binder to be used.

The recording material of the present invention can be prepared by a process comprising the steps of preparing a coating liquid for forming photo- and heat-sensitive recording layer, a coating liquid for forming photo- and pressure-sensitive recording layer, a coating liquid for forming protective layer, etc. by, for example, dissolving the respective constituent components in solvents, applying the coating liquids successively onto a desired support, and drying the coating layers.

Examples of the solvent that can be used for the preparation of the coating liquids include water; alcohols such as methanol, ethanol, n-propanol, isopropanol, n-butanol, sec-butanol, methyl cellosolve, and 1-methoxy-2-propanol; halogen-based solvents such as methylene chloride and ethylene chloride; ketones such as acetone, cyclohexanone, and methyl ethyl ketone; esters such as methyl cellosolve acetate, ethyl acetate, and methyl acetate; toluene; xylene; and a mixture of two or more thereof. Among these solvents, water is particularly preferable.

When applying the coating liquid for forming photo- and heat-sensitive recording layer or the coating liquid for forming photo- and pressure-sensitive recording layer onto the support, a blade coater, a rod coater, a knife coater, a roll-doctor coater, a reverse roll coater, a transfer roll coater, a gravure coater, a kiss roll coater, a curtain coater, an extrusion coater, etc. can be used.

The application can be performed by referring to the coating method described in Research Disclosure, Vol. 200 (1980, December, Item 20036 XV).

The thickness of the photo- and heat-sensitive recording layer or the photo- and pressure-sensitive recording layer is preferably in the range of 0.1 to 50 μm, more preferably in the range of 5 to 35 μm and most preferably in the range of 10 to 25 μm.

The recording material of the present invention obtained in the way described above can form full-color images excellent in tone and therefore can be used in various applications.

Examples of the applications include color printer, label, color proof, copier, facsimile, and secondary master drawings.

(Support)

Examples of the support for use in the recording material of the present invention include paper; coated paper; synthetic paper such as laminated paper; films such as polyethylene terephthalate film, cellulose triacetate film, polyethylene film, polystyrene film, and polycarbonate film; plates of metals such as aluminum, zinc, and copper; and these supports whose surface is treated with a surface treatment, a subbing layer, metal vapor deposition, etc. Further example is the support described in Research Disclosure, Vol. 200 (1980, December, Item 20036 XVII). These supports may contain a fluorescent brightener, a bluing dye, a pigment, or the like. Furthermore, the support itself may be made of an elastic sheet such as a polyurethane foam or rubber sheet.

If necessary, an antihalation layer may be provided on the surface of the support to be used; and a sliding layer, an antistatic layer, a curl-preventive layer, an adhesive layer, or the like may be provided on the back of the support to be used.

Further, if necessary, an adhesive layer may be provided between a support and the photo- and heat-sensitive recording layer or the photo- and pressure-sensitive recording layer such that the support is used as a peel paper to thereby provide an aspect having a seal.

When an antihalation layer is provided between a support and the photo- and heat-sensitive recording layer or the photo- and pressure-sensitive recording layer, or alternatively, on the support surface facing the side having no photo- and heat-sensitive recording layer or photo- and pressure-sensitive recording layer in the case of a transparent support, the antihalation layer may be one that can be bleached by irradiation with light or by the application of heat.

For the preparation of a layer that can be bleached by irradiation with light, for example, a combination of the organic dye and the organoboron compound described previously can be used. For the preparation of a layer that can be bleached by heat, for example, a composition, in which the heat generates a base or nucleophile capable of bleaching the organic dye that is present, can be utilized.

Between a support and the photo- and heat-sensitive recording layer or the photo- and pressure-sensitive recording layer, a layer, which comprises a polymer such as gelatin, polyvinyl alcohol (PVA), or the like having a low oxygen transmission rate, can be provided. The presence of this layer makes it possible to effectively prevent the fading due to photooxidation of the images formed.

Images can be formed in the recording material of the present invention by carrying out heat or pressure development either simultaneously with the exposure for latent image formation or after the exposure.

Conversion into visible images can be made by heat development if the recording material of the present invention is a photo- and heat-sensitive recording material or by pressure development if the recording material of the present invention is a photo- and pressure-sensitive recording material.

Images can be formed in the photo- and heat-sensitive recording material of the present invention by carrying out heat development either simultaneously with the exposure for latent image formation or after the exposure.

A conventionally known heating method can be employed for the heat development. Generally, the heating temperature is preferably 80 to 200° C., more preferably 83 to 160° C. and most preferably 85 to 130° C. The duration of heating is preferably in the range of 3 seconds to 1 minute, more preferably in the range of 4 to 45 seconds and most preferably in the range of 5 to 30 seconds.

The photo- and heat-sensitive recording material of the present invention comprises a photopolymerization initiator or the like such as a spectral sensitizing dye. Therefore, the recording material of the present invention is colored with the photopolymerization initiator or the like. Since background is also colored with the compound, it is very important for the method of the present invention that the colored background is decolorized by irradiation after heat development.

Accordingly, it is preferable that, after the heat development, the recording layer surface is irradiated with light to fix the images formed and to decolorize, decompose, or deactivate the components such as a spectral sensitizing compound and a diazonium salt compound which remain in the recording layer and decrease the whiteness of the background.

By carrying out the irradiation described above, it is possible to inhibit the coloration reaction because the components that remain in the recording layer including the background (non-image portions) and color the background can be eliminated and the remnant diazonium salts are deactivated. As a result, the density variation in the images can be inhibited and the image storability can be largely enhanced.

The use of the photo- and heat-sensitive recording material of the present invention is not limited to the mode according to the recording method described above, and the photo- and heat-sensitive recording material of the present invention can also be used by other conventionally known methods.

For example, the photo- and heat-sensitive recording material of the present invention can be used in thermal recording by use of a heating device such as a thermal head. It can also be used in the recording method, proposed by 3M Corporation and described in International Application WO95/31745, wherein images are formed by irradiation with a laser beam for use in a silver halide photo- and heat-sensitive recording material in order to raise contrast and image quality.

This is an imaging technique for forming latent images by laser beam irradiation according to image distribution, which technique comprises (1) preparing a radiant light source capable of forming a beam spot in which at least one of height and length is not greater than 600 µm on a target recording material, (2) setting the recording material sensitive to the light source to the predetermined target position, and (3) making adjustment such that the light source becomes a beam spot in which at least one of length and width is not greater than 250 µm and thereafter carrying out the irradiation according to the image distribution, (4) wherein the irradiated spot is overlapped with at least some beam spots successively emitted.

In other words, this is a method for forming latent images by exposing a recording material to light, which method basically comprises (1) preparing a light source for the exposure, and (2) causing the beam spots of the light source to irradiate a plurality of small regions each having a height or length of not greater than 600 µm such that at least 10% of the energy required for at least one of the small regions, i.e., at least 10% of the plural small regions, overlaps with one of other small regions.

In addition, the photo- and heat-sensitive recording material of the present invention can also be used in the recording method for obtaining higher-quality images proposed by Canon Inc. and described in JP-A No. 60-195568 wherein angle of incidence of the laser beam irradiating the recording material surface is inclined such that the reflection pitch produced by the incident beam, which reflects at the interface of the photosensitive layer of the recording material, becomes larger than the beam spot diameter to thereby prevent the optical interference that may occur in the recording material. In this case, the color density of the images can be controlled by adjusting the energy of the laser beam for the irradiation.

The method of applying pressure at the time of development processing under pressure may be appropriately selected from conventionally known methods. Generally, the development processing can be performed using pressure-type platen rollers, point-contact balls, etc.

The pressure that is to be applied is preferably 10 to 300 kg/cm$^2$, more preferably 80 to 250 kg/cm$^2$ and most preferably 130 to 200 kg/cm$^2$.

If the pressure is less than 10 kg/cm$^2$, sufficient density of developed color may not be obtained, whereas, if the pressure exceeds 300 kg/cm$^2$, the discrimination of the images may not be sufficient because even the hardened microcapsules are broken. After the pressure development processing, the photo- and pressure-sensitive recording layer surface is irradiated with light so as to fix the image formed and decolorize, decompose, or deactivate the components remaining in the recording layer.

By carrying out the irradiation described above, it is possible to inhibit the coloration reaction because the components that remain in the recording layer including the background (non-image portions) can be eliminated and, if diazonium salts are used, the remnant diazonium salts are deactivated. As a result, the density variation in the images can be inhibited and the image storability can be largely enhanced.

<Recording Process>

Next, the recording process of the present invention is explained below. The recording process of the present invention is intended for processing the photo- and heat-sensitive recording material of the present invention, which process comprises at least an exposure step in which the material is exposed image-wise to light so that the photopolymerizable composition forms a latent image, a color development step in which heat is applied so that the color-forming components develop colors according to the latent image to thereby produce images, and a fixing step in which the recording layer surface is irradiated with light so as to fix the image formed and decolorize the organic dyes. Besides, the recording process of the present invention enables the use of a photo- and pressure-sensitive recording material by employing the process described above wherein the color development step comprises applying pressure so that the color-forming components develop colors according to the latent image to thereby produce images.

In the exposure step, the photopolymerizable composition in the layer is exposed image-wise according to the pattern of a desired image shape and forms a latent image. After that, when the recording layer surface is heated or pressed in the color development step, the color-forming component in the photo- and heat-sensitive recording layer is caused to react with a compound designed to react with the color-forming component to develop a color, or caused to react with a specific group, which is designed to develop a color, of a compound. In this way, a color is developed according to the shape of the latent image that is previously formed and an image is formed. In this case, in order to control the maximum density of the developed color within a preferable range, it is possible to employ, for example, a means for exposing the whole face to an amount of light which has wavelengths corresponding to the sensitive regions of respective colors and can provide a desired density of the developed color.

The light source for use in the exposure step may be any light source selected from the light sources having wavelengths ranging from ultraviolet to infrared light if the photo- and heat-sensitive recording layer contains a light-absorbing material such as a spectral sensitizing compound that exhibits an absorption in a specific wavelength region. More specifically, a light source providing maximum absorption wavelengths ranging from 300 to 1000 nm is preferable.

In this case, it is preferable to select and use a light source whose wavelength matches the absorption wavelength of the light-absorbing material such as an organic dye to be used. The selective use of such light-absorbing material enables the use of a blue to red light source and the use of a small-sized, inexpensive infrared laser device and consequently not only broadens the use of the recording material of the present invention but also raises sensitivity and image sharpness.

Among the light sources, it is particularly preferable to use a laser light source such as a blue, green, or red laser light source or an LED from the viewpoint of simplicity, downsizing, and low cost of the device.

According to the image recording process of the present invention, after the color development step, the recording layer surface is subjected to a fixing step in which the whole recording layer surface is irradiated with light from a specific light source to fix the images formed and to decolorize photopolymerization initiator components remaining in the recording layer. By carrying out the fixing step described above, it is possible to enhance the whiteness of the non-image portions and to obtain final images that are chemically stable. When a diazonium salt compound is used as a color-forming component, since the diazonium salt remaining in the recording layer can also be deactivated by the irradiation with light, the image formed is free from density variation, discoloration, and the like and the image storability can be enhanced.

As for the light source that can be used in the fixing step, a wide range of light sources, such as a mercury lamp, an ultrahigh pressure mercury lamp, an electrodeless discharge-type mercury lamp, a xenon lamp, a tungsten lamp, a metal halide lamp, and a fluorescent lamp, can be suitably used.

In particular, it is preferable to suitably select and use a light source whose wavelength matches the absorption wavelength of the organic dye and organoboron compound to be used in the photo- and heat-sensitive recording layer or the photo- and pressure-sensitive recording layer of the photo- and heat-sensitive recording material.

The method of irradiating the recording layer with light from the light source in the fixing step is not particularly limited. The whole recording layer surface may be irradiated with light at one time or the recording layer surface may be gradually irradiated with light by scanning or the like until the irradiation of the surface finally ends. That is, any method that finally enables the irradiation of the entire surface of the photo- and heat-sensitive recording material after image formation with nearly uniform light may be employed. The irradiation of the entire recording layer is preferable from the standpoint of the enhancement of the effects of the present invention.

The duration of the irradiation with light from the light source needs to be the time period that allows the produced images to be fixed and the background to be sufficiently decolorized. In order to perform sufficient fixing of images and decolorization, the duration of the irradiation is preferably in the range of several seconds to tens of minutes and more preferably in the range of several seconds to several minutes.

EXAMPLES

The examples of the present invention will now be explained below. However, it should be noted that the present invention is not limited to these examples. In the following examples, "part" means "part by mass" and "%" means "mass %".

<Preparation of a Microcapsule Liquid Containing Microcapsules Enclosing an Electron-Donating, Colorless Dye>

(1-a) Preparation of a Microcapsule Liquid (I) Containing Microcapsules Enclosing an Electron-Donating, Colorless Dye 8.9 g of the following electron-donating, colorless dye (1) that was to form a yellow color was dissolved in 16.9 g of ethyl acetate. To the solution were added 20 g of a capsule wall material (tradename "TAKENATE D-110N" manufactured by Takeda Chemical Industries, Ltd.) and 2 g of a capsule wall material (tradename "MILLIONATE MR 200" manufactured by Nippon Polyurethane Industries, Ltd.).

The resulting solution was added to a mixture of 42 g of an 8% solution of phthalated gelatin and 1.4 g of a 10% solution of sodium dodecylbenzenesulfonate. The resulting mixture was emulsified at 20° C. and an emulsion was obtained. To the emulsion thus obtained were added 14 g of water and 72 g of a 2.9% aqueous solution of tetraethylene pentamine. After that, while being stirred, the mixture was heated to 60° C. and was kept at that temperature for 2 hours. In this way, a microcapsule liquid (I) containing microcapsules, enclosing the following electron-donating, colorless dye (1) as the core and having an average particle diameter of 0.5 μm, was obtained.

(1-b) Preparation of a Microcapsule Liquid (II) Containing Microcapsules Enclosing an Electron-Donating, Colorless Dye A microcapsule liquid (II) containing microcapsules, enclosing the following electron-donating, colorless dye (2) as the core and having an average particle diameter of 0.5 μm, was obtained in the same way as in (1-a), except that the following electron-donating, colorless dye (2) that was to form a magenta color was used in place of the following electron-donating, colorless dye (1) that was used in (1-a).

(1-c) Preparation of a Microcapsule Liquid (III) Containing Microcapsules Enclosing an Electron-Donating, Colorless Dye A microcapsule liquid (III) containing microcapsules, enclosing the following electron-donating, colorless dye (3) as the core and having an average particle diameter of 0.5 μm, was obtained in the same way as in (1-a), except that the following electron-donating, colorless dye (3) that was to form a cyan color was used in place of the following electron-donating, colorless dye (1) that was used in (1-a).

Electron-donating, colorless dye (3)

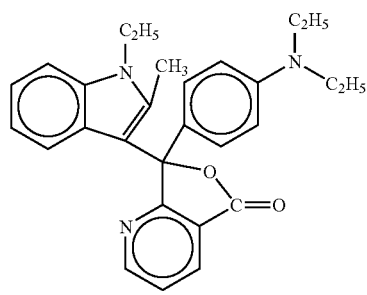

<Preparation of an Emulsion of a Photopolymerizable Composition>

(2-a) Preparation of an Emulsion (1) of a Photopolymerizable Composition (Using 4 Moles of an Organoboron Compound)

5 g of a mixture of the following electron-accepting compounds (1) and (2) each having a polymerizable group and 0.017 g of the following thermal polymerization inhibitor (ALI) were dissolved in 5.5 g of isopropyl acetate (having a solubility in water of about 4.3%) at 42° C. To the resulting solution at 42° C. were added 0.042 g of the cationic organic dye (1-16), 0.13 g (equivalent to 4 moles) of the organoboron compound (A-6), and 0.042 g of the following aid for raising sensitivity, and a solution was prepared.

The solution thus obtained was added to a mixture of 13 g of an 8% aqueous solution of gelatin and 0.8 g of a 10% aqueous solution of the following surfactant (1). The resulting mixture was emulsified at a revolution of 10000 rpm for 5 minutes by means of HOMOGENIZER (manufactured by NIPPON SEIKI Co., Ltd.), and an emulsion (1) of a photopolymerizable composition was obtained.

Electron-donating, colorless dye (1)

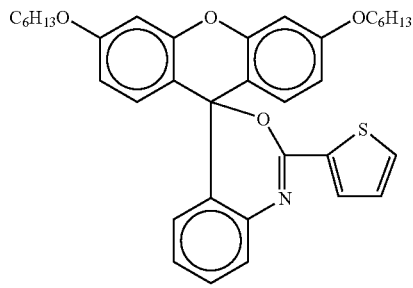

Electron-accepting compound having a polymerizable group

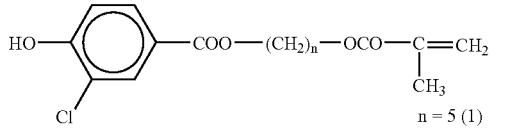

n = 5 (1)
n = 6 (2)

ALI

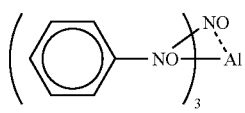

Electron-donating, colorless dye (2)

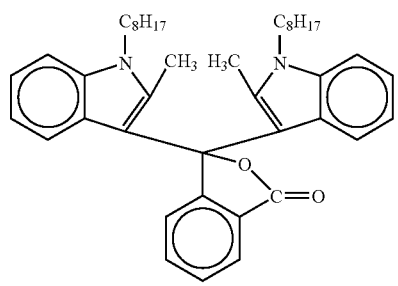

Aid (1)

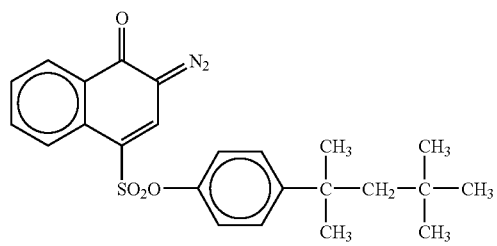

Surfactant (1)

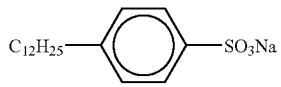

(2-b) Preparation of an Emulsion (2) of a Photopolymerizable Composition (Using 8 Moles of an Organoboron Compound)

An emulsion (2) of a photopolymerizable composition was obtained in the same way as in (2-a), except that 0.26 g (equivalent to 8 moles) of the organoboron compound (A-6) was used in place of 0.13 g (equivalent to 4 moles) of the organoboron compound (A-6) used in (2-a).

(2-c) Preparation of an Emulsion (3) of a Photopolymerizable Composition (Using 14 Moles of an Organoboron Compound)

An emulsion (3) of a photopolymerizable composition was obtained in the same way as in (2-a), except that 0.46 g (equivalent to 14 moles) of the organoboron compound (A-6) was used in place of 0.13 g (equivalent to 4 moles) of the organoboron compound (A-6) used in (2-a).

(2-d) Preparation of an Emulsion (4) of a Photopolymerizable Composition (Using 8 Moles of an Organoboron Compound)

An emulsion (4) of a photopolymerizable composition was obtained in the same way as in (2-a), except that 0.25 g (equivalent to 8 moles) of the organoboron compound (20-i) was used in place of the organoboron compound (A-6) used in (2-a).

(2-e) Preparation of an Emulsion (5) of a Photopolymerizable Composition (Using a Combination of Organoboron Compounds)

An emulsion (5) of a photopolymerizable composition was obtained in the same way as in (2-a), except that 0.25 g (equivalent to 8 moles) of the organoboron compound (20-i) was used together with 0.26 g (equivalent to 8 moles) of the organoboron compound (A-6) used in (2-b).

(2-f) Preparation of an Emulsion (6) of a Photopolymerizable Composition (Using 8 Moles of an Organoboron Compound)

An emulsion (6) of a photopolymerizable composition was obtained in the same way as in (2-a), except that 0.042 g of the cationic organic dye (1-12) was used in place of the cationic organic dye (1-16) used in (2-a) and 0.26 g (equivalent to 8 moles) of the organoboron compound (A-6) was used.

(2-g) Preparation of an Emulsion (7) of a Photopolymerizable Composition (Using a Combination of Organoboron Compounds)

An emulsion (7) of a photopolymerizable composition was obtained in the same way as in (2-a), except that 0.042 g of the cationic organic dye (1-12) was used in place of the cationic organic dye (1-16) used in (2-a) and 0.25 g (equivalent to 8 moles) of the organoboron compound (20-i) was used together with 0.26 g (equivalent to 8 moles) of the organoboron compound (A-6).

(2-h) Preparation of an Emulsion (8) of a Photopolymerizable Composition (Using 4 Moles of an Organoboron Compound)

An emulsion (8) of a photopolymerizable composition was obtained in the same way as in (2-a), except that 0.042 g of the cationic organic dye (3-15) was used in place of the cationic organic dye (1-16) used in (2-a) and 0.25 g (equivalent to 4 moles) of the organoboron compound (29) was used in place of the organoboron compound (A-6).

(2-i) Preparation of an Emulsion (9) of a Photopolymerizable Composition (Using a Combination of Organoboron Compounds)

An emulsion (9) of a photopolymerizable composition was obtained in the same way as in (2-a), except that 0.042 g of the cationic organic dye (3-15) was used in place of the cationic organic dye (1-16) used in (2-a) and a combination of 0.25 g (equivalent to 4 moles) of the organoboron compound (29) and 0.25 g (equivalent to 8 moles) of the organoboron compound (20-i) was used in place of the organoboron compound (A-6).

(2-j) Preparation of an Emulsion (10) of a Photopolymerizable Composition (Using 8 Moles of an Organoboron Compound)

An emulsion (10) of a photopolymerizable composition was obtained in the same way as in (2-a), except that 0.042 g of the cationic organic dye (2-1) was used in place of the cationic organic dye (1-16) used in (2-a) and 0.167 g (equivalent to 8 moles) of the organoboron compound (A-6) was used in place of 0.13 g of the organoboron compound (A-6).

(2-K) Preparation of an Emulsion (11) of a Photopolymerizable Composition For a Comparative Example (Using 0.5 Moles of an Organoboron Compound)

An emulsion (11) of a photopolymerizable composition was obtained in the same way as in (2-a), except that 0.016 g (equivalent to 0.5 moles) of the organoboron compound (A-6) was used in place of 0.13 g of the organoboron compound (A-6) used in (2-a).

(2-L) Preparation of an Emulsion (12) of a Photopolymerizable Composition for a Comparative Example (Using 0.5 Moles of an Organoboron Compound)

An emulsion (12) of a photopolymerizable composition was obtained in the same way as in (2-f), except that 0.015 g (equivalent to 0.5 moles) of the organoboron compound (A-6) was used in place of 0.26 g of the organoboron compound (A-6) used in (2-f).

(2-M) Preparation of an Emulsion (13) of a Photopolymerizable Composition for a Comparative Example (Using 0.5 Moles of an Organoboron Compound)

An emulsion (13) of a photopolymerizable composition was obtained in the same way as in (2-h), except that 0.032 g (equivalent to 0.5 moles) of the organoboron compound (29) was used in place of 0.25 g of the organoboron compound (29) used in (2-h).

<Preparation of Coating Liquids for Photo- and Heat-Sensitive Recording Layer>

(3-a) Preparation of a Coating Liquid (1) for Photo- and Heat-Sensitive Recording Layer-[Magenta]

A coating liquid (1) for photo- and heat-sensitive recording layer was prepared by mixing 2 g of the microcapsule liquid (II) containing microcapsules enclosing an electron-donating, colorless dye, 8 g of the emulsion (1) of a photopolymerizable composition, and 1.5 g of a 4% aqueous solution of gelatin.

(3-b) Preparation of a Coating Liquid (2) for Photo- and Heat-Sensitive Recording Layer-[Magenta]

A coating liquid (2) for photo- and heat-sensitive recording layer was prepared by mixing 2 g of the microcapsule liquid (II) containing microcapsules enclosing an electron-donating, colorless dye, 8 g of the emulsion (2) of a photopolymerizable composition, and 1.5 g of a 4% aqueous solution of gelatin.

(3-c) Preparation of a Coating Liquid (3) for Photo- and Heat-Sensitive Recording Layer-[Magenta]

A coating liquid (3) for photo- and heat-sensitive recording layer was prepared by mixing 2 g of the microcapsule liquid (II) containing microcapsules enclosing an electron-donating, colorless dye, 8 g of the emulsion (3) of a photopolymerizable composition, and 1.5 g of a 4% aqueous solution of gelatin.

(3-d) Preparation of a Coating Liquid (4) for Photo- and Heat-Sensitive Recording Layer-[Magenta]

A coating liquid (4) for photo- and heat-sensitive recording layer was prepared by mixing 2 g of the microcapsule liquid (II) containing microcapsules enclosing an electron-donating, colorless dye, 8 g of the emulsion (4) of a photopolymerizable composition, and 1.5 g of a 4% aqueous solution of gelatin.

(3-e) Preparation of a Coating Liquid (5) for Photo- and Heat-Sensitive Recording Layer-[Magenta]

A coating liquid (5) for photo- and heat-sensitive recording layer was prepared by mixing 2 g of the microcapsule liquid (II) containing microcapsules enclosing an electron-donating, colorless dye, 8 g of the emulsion (5) of a photopolymerizable composition, and 1.5 g of a 4% aqueous solution of gelatin.

(3-f) Preparation of a Coating Liquid (6) for Photo- and Heat-Sensitive Recording Layer-[Cyan]

A coating liquid (6) for photo- and heat-sensitive recording layer was prepared by mixing 2 g of the microcapsule liquid (III) containing microcapsules enclosing an electron-donating, colorless dye, 5.5 g of the emulsion (6) of a photopolymerizable composition, and 1.0 g of a 4% aqueous solution of gelatin.

(3-g) Preparation of a Coating Liquid (7) for Photo- and Heat-Sensitive Recording Layer-[Cyan]

A coating liquid (7) for photo- and heat-sensitive recording layer was prepared by mixing 2 g of the microcapsule liquid (III) containing microcapsules enclosing an electron-donating, colorless dye, 5.5 g of the emulsion (7) of a photopolymerizable composition, and 1.0 g of a 4% aqueous solution of gelatin.

(3-h) Preparation of a Coating Liquid (8) for Photo- and Heat-Sensitive Recording Layer-[Yellow]

A coating liquid (8) for photo- and heat-sensitive recording layer was prepared by mixing 4 g of the microcapsule liquid (I) containing microcapsules enclosing an electron-donating, colorless dye, 8 g of the emulsion (8) of a photopolymerizable composition, and 2 g of a 4% aqueous solution of gelatin.

(3-i) Preparation of a Coating Liquid (9) for Photo- and Heat-Sensitive Recording Layer-[Yellow]

A coating liquid (9) for photo- and heat-sensitive recording layer was prepared by mixing 4 g of the microcapsule liquid (I) containing microcapsules enclosing an electron-donating, colorless dye, 8 g of the emulsion (9) of a photopolymerizable composition, and 2 g of a 4% aqueous solution of gelatin.

(3-j) Preparation of a Coating Liquid (10) for Photo- and Heat-Sensitive Recording Layer-[Magenta]

A coating liquid (10) for photo- and heat-sensitive recording layer was prepared by mixing 2 g of the microcapsule liquid (II) containing microcapsules enclosing an electron-donating, colorless dye, 8 g of the emulsion (10) of a photopolymerizable composition, and 1.5 g of a 4% aqueous solution of gelatin.

(3-K) Preparation of a Coating Liquid (11) for Photo- and Heat-Sensitive Recording Layer-[Magenta]

A coating liquid (11) for photo- and heat-sensitive recording layer was prepared by mixing 2 g of the microcapsule liquid (II) containing microcapsules enclosing an electron-donating, colorless dye, 8 g of the emulsion (11) of a photopolymerizable composition, and 1.5 g of a 4% aqueous solution of gelatin.

(3-L) Preparation of a Coating Liquid (12) for Photo- and Heat-Sensitive Recording Layer for a Comparative Example-[Cyan]

A coating liquid (12) for photo- and heat-sensitive recording layer was prepared by mixing 2 g of the microcapsule liquid (III) containing microcapsules enclosing an electron-donating, colorless dye, 5.5 g of the emulsion (12) of a photopolymerizable composition, and 1.0 g of a 4% aqueous solution of gelatin.

(3-M) Preparation of a Coating Liquid (13) for Photo- and Heat-Sensitive Recording Layer for a Comparative Example-[Yellow]

A coating liquid (13) for photo- and heat-sensitive recording layer was prepared by mixing 4 g of the microcapsule liquid (I) containing microcapsules enclosing an electron-donating, colorless dye, 8 g of the emulsion (13) of a photopolymerizable composition, and 2.0 g of a 4% aqueous solution of gelatin.

<Preparation of Coating Liquid for Intermediate Layer>

(Preparation of a Dispersion Liquid (1) of Swellable Synthetic Mica)

A dispersion liquid (1) of swellable synthetic mica was prepared by a process comprising the steps of adding 12 g of synthetic mica (SUZULITE 40H, manufactured by MRI Co., Ltd.) to 188 g of water containing 2 g of sodium dodecylsulfate, stirring the mixture at a revolution of 10000 rpm for 30 minutes by means of a homogenizer, and adding 200 g of a 5.6% aqueous solution of gelatin.

<Preparation of Coating Liquid for Intermediate Layer>

A coating liquid (1) for intermediate layer was prepared by mixing 8.5 g of a 16% aqueous solution of gelatin, 12.6 g of distilled water, 5.5 g of the dispersion liquid (1) of swellable synthetic mica, and 1.6 g of a 2% aqueous solution of the following surfactant (2).

<Preparation of Coating Liquid for Protective Layer>

A coating liquid (1) for protective layer was prepared by mixing 8.8 g of a 18% aqueous solution of gelatin, 7.0 g of distilled water, 0.4 g of a 2% aqueous solution of the following surfactant (2), 1.2 g of a 2% aqueous solution of the following surfactant (3), 8.8 g of a 2% aqueous solution of a vinylsulfone-based compound (hardener), and 1.8 g of 20% JULYMER AC10LA (polyacrylic acid, manufactured by Nippon Pure Chemicals Co., Ltd.).

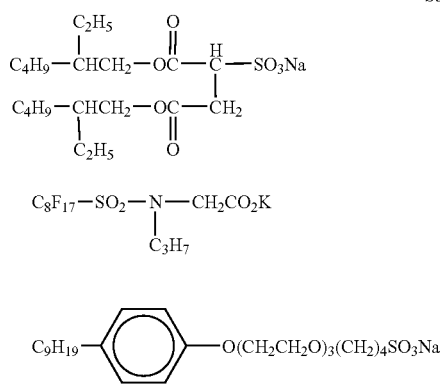

Surfactant (2)

Surfactant (4)

Surfactant (3)

Example 1

Magenta Coloration

The coating liquid (1) for photo- and heat-sensitive recording layer was applied using a coating bar onto a 198 μm-thick WP support such that the dry mass of the entire coating layer was 3.0 g/cm², and the coating layer was dried.

The layer was overcoated with the coating liquid (1) for protective layer using a coating bar such that the dry mass of this coating layer was 2 g/cm², and the coating layer was dried. In this way, a photo- and heat-sensitive recording material (1) was obtained.

The photo- and heat-sensitive recording material (1) was exposed by use of a semiconductor-excited, solid-state laser having a wavelength of 532 nm from the protective layer side, wherein the maximum irradiation energy was 1.2 mJ/cm² and the irradiation energy was varied stepwise so that a step-wedge image was formed.

The recording material having a latent image after the exposure described above was heated for 10 seconds by means of a hot plate at 110° C. After that, the entire surface of the recording layer was irradiated with light for 30 seconds on a 38000 lux fluorescent lamp irradiator. The irradiation produced sharp coloration, and a step-wedge image having high-level whiteness in the background was obtained.

<Assessment of Sensitivity>

The energy required until the background of the material was formed (i.e., "the energy required until the background was formed") was calculated. This value was used as an indicator of sensitivity.

The smaller the value, the higher the sensitivity is. The results of the measurements are shown in Table 1.

<Thermal Treatment>

The photo- and heat-sensitive recording material (1) that had undergone the processing described above was left to stand under an environment of 50° C. and 80% relative humidity for one day.

<Measurement of Density>

The coloration density (Dmax), the fogging (Dmin) of the background, and the fogging (Dmin-S) of the background after the thermal treatment were measured by Macbeth transmission densitometer or Macbeth reflection densitometer (manufacture by Macbeth Corp.).

The results of the measurements, together with the results of the previous measurements, are shown in Table 1.

Example 2

Magenta Coloration

A photo- and heat-sensitive recording material (2) was obtained in the same way of application and drying as in Example 1, except that the coating liquid (1) for photo- and heat-sensitive recording layer was replaced with the coating liquid (2) for photo- and heat-sensitive recording layer. The assessment was carried out in the same way as in Example 1 and the results are shown in Table 1.

Example 3

Magenta Coloration

A photo- and heat-sensitive recording material (3) was obtained in the same way of application and drying as in Example 1, except that the coating liquid (1) for photo- and heat-sensitive recording layer was replaced with the coating liquid (3) for photo- and heat-sensitive recording layer. The assessment was carried out in the same way as in Example 1 and the results are shown in Table 1.

Example 4

Magenta Coloration

A photo- and heat-sensitive recording material (4) was obtained in the same way of application and drying as in Example 1, except that the coating liquid (1) for photo- and heat-sensitive recording layer was replaced with the coating liquid (4) for photo- and heat-sensitive recording layer. The assessment was carried out in the same way as in Example 1 and the results are shown in Table 1.

Example 5

Magenta Coloration

A photo- and heat-sensitive recording material (5) was obtained in the same way of application and drying as in Example 1, except that the coating liquid (1) for photo- and heat-sensitive recording layer was replaced with the coating liquid (5) for photo- and heat-sensitive recording layer. The assessment was carried out in the same way as in Example 1 and the results are shown in Table 1.

Example 6

Cyan Coloration

A photo- and heat-sensitive recording material (6) was obtained in the same way of application and drying as in Example 1, except that the coating liquid (1) for photo- and heat-sensitive recording layer was replaced with the coating liquid (6) for photo- and heat-sensitive recording layer and the dry mass of the entire coating layer was 3.5 g/m². The assessment was carried out in the same way as in Example 1, except that exposure was made using as the recording laser a semiconductor-excited, solid-state laser having a wavelength of 657 nm, wherein the maximum irradiation energy was 1.2 mJ/cm² and the irradiation energy was varied stepwise so that a step-wedge image was formed. The results are shown in Table 1.

Example 7

Cyan Coloration

A photo- and heat-sensitive recording material (7) was obtained in the same way of application and drying and assessment carried out in the same way as in Example 6, except that the coating liquid (1) for photo- and heat-sensitive recording layer was replaced with the coating liquid (7) for photo- and heat-sensitive recording layer and the dry mass of the entire coating layer was 3.5 g/m². The results are shown in Table 1.

Example 8

Yellow Coloration

A photo- and heat-sensitive recording material (8) was obtained in the same way of application and drying as in Example 1, except that the coating liquid (1) for photo- and heat-sensitive recording layer was replaced with the coating liquid (8) for photo- and heat-sensitive recording layer and the dry mass of the entire coating layer was 4.5 g/m². The assessment was carried out in the same way as in Example 1, except that exposure was made using as the recording laser a semiconductor laser having a wavelength of 405 nm, wherein the maximum irradiation energy was 1.2 mJ/cm² and the irradiation energy was varied stepwise so that a step-wedge image was formed. The results are shown in Table 1.

Example 9

Yellow Coloration

A photo- and heat-sensitive recording material (9) was obtained in the same way of application and drying and assessment carried out in the same way as in Example 8, except that the coating liquid (1) for photo- and heat-sensitive recording layer was replaced with the coating liquid (9) for photo- and heat-sensitive recording layer and the dry mass of the entire coating layer was 4.5 g/m². The results are shown in Table 1.

Example 10

Magenta Coloration

A photo- and heat-sensitive recording material (10) was obtained in the same way of application and drying as in Example 1, except that the coating liquid (1) for photo- and heat-sensitive recording layer was replaced with the coating liquid (10) for photo- and heat-sensitive recording layer. The assessment was carried out in the same way as in Example 1 and the results are shown in Table 1.

Example 11

Polychrome Coloration

The coating liquid (8) for photo- and heat-sensitive recording layer (for yellow coloration) was applied using a coating bar onto a 198 μm-thick WP support such that the dry mass of the entire coating layer was 4.5 g/cm², and the coating layer was dried. The layer was overcoated with the coating liquid (1) for intermediate layer using a coating bar such that the dry mass of this coating layer was 1.0 g/cm², and the coating layer was dried.

Onto the intermediate layer was applied the coating liquid (2) for photo- and heat-sensitive recording layer (for magenta coloration) using a coating bar such that the dry mass of the entire coating layer was 6 g/cm², and the coating layer was dried. The layer was overcoated with the coating liquid for intermediate layer such that the dry mass of this coating layer was 1.0 g/cm², and the coating layer was dried.

Onto the intermediate layer was applied the coating liquid (6) for photo- and heat-sensitive recording layer (for cyan coloration) using a coating bar such that the dry mass of the entire coating layer was 3.5 g/cm², and the coating layer was dried. The layer was overcoated with the coating liquid (1) for protective layer such that the dry mass of this coating layer was 2.0 g/cm², and the coating layer was dried. In this way, a photo- and heat-sensitive recording material (11) was obtained.

The photo- and heat-sensitive recording material (11) was irradiated simultaneously with a semiconductor-excited, solid-state laser having a wavelength of 657 nm, a semiconductor-excited, solid-state laser having a wavelength of 532 nm, and a semiconductor laser having a wavelength of 405 nm from the protective layer side.

The recording material having a latent image after the exposure described above was heated for 10 seconds by means of a hot plate at 110° C. After that, the entire surface of the recording layer was irradiated with light for 30 seconds on a 38000 lux fluorescent lamp irradiator. The irradiation produced sharp polychrome coloration, and a color image having high-level whiteness in the background was obtained. The fogging densities of the photo- and heat-sensitive recording material (11) before and after the thermal treatment were measured in the same way as in Example 1 and the results are shown in Table 1.

Comparative Example

Comparative Example 1

Magenta Coloration

A photo- and heat-sensitive recording material (12) was obtained in the same way of application and drying as in Example 1, except that the coating liquid (1) for photo- and heat-sensitive recording layer was replaced with the coating liquid (11) for photo- and heat-sensitive recording layer for the comparative example. The assessment was carried out in the same way as in Example 1 and the results are shown in Table 1.

Comparative Example 2

Cyan Coloration

A photo- and heat-sensitive recording material (13) was obtained in the same way of application and drying as in Example 1, except that the coating liquid (1) for photo- and heat-sensitive recording layer was replaced with the coating liquid (12) for photo- and heat-sensitive recording layer for comparative example. The assessment was carried out in the same way as in Example 6 and the results are shown in Table 1.

Comparative Example 3

Yellow Coloration

A photo- and heat-sensitive recording material (14) was obtained in the same way of application and drying as in Example 1, except that the coating liquid (1) for photo- and heat-sensitive recording layer was replaced with the coating liquid (13) for photo- and heat-sensitive recording layer for comparative example. The assessment was carried out in the same way as in Example 8 and the results are shown in Table 1.

group, a substituted heterocyclic group, and a derivative thereof; Rs may be the same as or different from each other; two or more of these groups may join together directly or via a substituent and form a boron-

TABLE 1

|  | photo- and heat-sensitive recording material | organoboron compound/organic dye (molar ratio) | Sensitivity (mJ/cm$^2$) | Dmax | Dmin (*1) | Dmin-S (after thermal treatment) |
|---|---|---|---|---|---|---|
| Example 1 | photo- and heat-sensitive recording material (1) | 4 | 10.4 | 2.30 | 0.11(M) | 0.13 |
| Example 2 | photo- and heat-sensitive recording material (2) | 8 | 0.4 | 2.20 | 0.09(M) | 0.10 |
| Example 3 | photo- and heat-sensitive recording material (3) | 14 | 0.3 | 2.25 | 0.08(M) | 0.09 |
| Example 4 | photo- and heat-sensitive recording material (4) | 8 | 1.5 | 2.20 | 0.09(M) | 0.09 |
| Example 5 | photo- and heat-sensitive recording material (5) | 8 + 8 (in combination) | 0.4 | 2.20 | 0.08(M) | 0.09 |
| Example 6 | photo- and heat-sensitive recording material (6) | 8 | 0.2 | 2.20 | 0.09(C) | 0.09 |
| Example 7 | photo- and heat-sensitive recording material (7) | 8 + 8 (in combination) | 0.2 | 2.10 | 0.08(C) | 0.09 |
| Example 8 | photo- and heat-sensitive recording material (8) | 4 | 0.5 | 1.70 | 0.10(Y) | 0.11 |
| Example 9 | photo- and heat-sensitive recording material (9) | 4 + 4 (in combination) | 0.4 | 1.65 | 0.09(Y) | 0.09 |
| Example 10 | photo- and heat-sensitive recording material (10) | 8 | 0.6 | 2.10 | 0.09(M) | 0.10 |
| Example 11 | photo- and heat-sensitive recording material (11) | — | — | — | 0.09(V) | 0.10 |
| Comparative Example 1 | photo- and heat-sensitive recording material (12) | 0.5 | 100 | 2.30 | 0.55(M) | 0.58 |
| Comparative Example 2 | photo- and heat-sensitive recording material (13) | 0.5 | 50 | 2.20 | 0.60(C) | 0.65 |
| Comparative Example 3 | photo- and heat-sensitive recording material (14) | 0.5 | 125 | 1.72 | 0.30(Y) | 0.40 |

*1 = Macbeth density of remaining color of each dye (yellow, magenta, cyan, and visual) M/magenta C/cyan Y/yellow V/visual (polychrome)

The present invention made it possible to provide a photopolymerizable composition intended for the enhancement of sensitivity, storability, photo-fixability, decolorization of organic dyes, etc.

The recording material or the recording process of the present invention made it possible to provide a high-quality, black-and-white or color image that can be recorded by a blue to red laser, a small-sized inexpensive infrared laser, or the like and has high sensitivity, excellent whiteness in background, and high sharpness with high sensitivity in a perfectly dry processing system requiring no developing liquid or the like and producing no waste.

What is claimed is:

1. A photopolymerizable composition comprising:
   (a) a polymerizable compound having an addition-polymerizable unsaturated bond;
   (b) an organic dye; and
   (c) at least one kind of an organoboron compound represented by the following general formula (I) in a proportion of at least four moles of organoboron compound per mole of the organic dye:

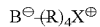  General formula (I)

wherein R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se;
   wherein the photopolymerizable composition further includes heat-responsive microcapsules comprising a color-forming component.

2. A photopolymerizable composition according to claim 1, wherein the organic dye is at least one selected from the group consisting of a cationic dye, an anionic dye, and a nonionic dye.

3. A photopolymerizable composition according to claim 1, wherein the polymerizable compound having an addition-polymerizable unsaturated bond is photoreactive and hardens due to photopolymerization.

4. A photopolymerizable composition according to claim 1, wherein the polymerizable compound having an addition-polymerizable unsaturated bond is at least one of a substantially colorless compound having in the molecule thereof a polymerizable group and a site which reacts with a color-forming component so as to develop a color and a substantially colorless compound having in the molecule thereof a polymerizable group and a site which inhibits the reaction between a color-forming component and another compound.

5. A photopolymerizable composition comprising:
   (a) a polymerizable compound having an addition-polymerizable unsaturated bond;
   (b) an organic dye; and (c) at least one kind of an organoboron compound represented by the following general formula (I) in a proportion of at least four moles of organoboron compound per mole of the organic dye:

$$B^{\ominus}\text{-(R)}_4 X^{\oplus} \qquad \text{General formula (I)}$$

wherein R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se;

wherein the polymerizable compound having an addition-polymerizable unsaturated bond is at least one of a substantially colorless compound having in the molecule thereof a polymerizable group and a site which reacts with a color-forming component so as to develop a color and a substantially colorless compound having in the molecule thereof a polymerizable group and a site which inhibits the reaction between a color-forming component and another compound.

6. A photopolymerizable composition according to claim 5, wherein the organic dye is at least one selected from the group consisting of a cationic dye, an anionic dye, and a nonionic dye.

7. A photopolymerizable composition according to claim 5, wherein the polymerizable compound having an addition-polymerizable unsaturated bond is photoreactive and hardens due to photopolymerization.

8. A photopolymerizable composition comprising:
(a) a polymerizable compound having an addition-polymerizable unsaturated bond;
(b) an organic dye; and
(c) at least one kind of an organoboron compound represented by the following general formula (I) in a proportion of at least four moles of organoboron compound per mole of the organic dye:

$$B^{\ominus}\text{-(R)}_4 X^{\oplus} \qquad \text{General formula (I)}$$

wherein R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se;

wherein a recording material prepared by coating on a support a recording layer including the photopolymerizable composition is exposed to light so that the photopolymerizable composition forms a latent image, and heated so that color forming components develop colors according to the latent image to form an image, and the recording layer surface is irradiated with light so as to fix the image and decolorize the organic dye.

9. A photopolymerizable composition according to claim 8, wherein the organic dye is at least one selected from the group consisting of a cationic dye, an anionic dye, and a nonionic dye.

10. A photopolymerizable composition according to claim 8, wherein the polymerizable composition further includes heat-responsive microcapsules comprising a color-forming component.

11. A photopolymerizable composition according to claim 8, wherein the polymerizable compound having an addition-polymerizable unsaturated bond is photoreactive and hardens due to photopolymerization.

12. A photopolymerizable composition according to claim 8, wherein the polymerizable compound having an addition-polymerizable unsaturated bond is at least one of a substantially colorless compound having in the molecule thereof a polymerizable group and a site which reacts with a color-forming component so as to develop a color and a substantially colorless compound having in the molecule thereof a polymerizable group and a site which inhibits the reaction between a color-forming component and another compound.

13. A photopolymerizable composition comprising:
(a) a polymerizable compound having an addition-polymerizable unsaturated bond;
(b) an organic dye; and
(c) at least one kind of an organoboron compound represented by the following general formula (I) in a proportion of at least four moles of organoboron compound per mole of the organic dye:

$$B^{\ominus}\text{-(R)}_4 X^{\oplus} \qquad \text{General formula (I)}$$

wherein R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se;

wherein the photopolymerizable composition includes heat-responsive microcapsules including a color-forming component A, and, outside the microcapsules, a substantially colorless compound B having in the molecule thereof a polymerizable group and a site which reacts with the color-forming component A to develop a color, and a photopolymerization initiator comprising the organic dye and the organoboron compound.

14. A photopolymerizable composition comprising:
(a) a polymerizable compound having an addition-polymerizable unsaturated bond;

(b) an organic dye; and
(c) at least one kind of an organoboron compound represented by the following general formula (I) in a proportion of at least four moles of organoboron compound per mole of the organic dye:

            General formula (I)

wherein R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se;

wherein the photopolymerizable composition includes heat-responsive microcapsules including a color-forming component A, and, outside the microcapsules, a substantially colorless compound C having a site which reacts with the color-forming component A to develop a color, a substantially colorless compound D having in the molecule thereof a polymerizable group and a site which inhibits reaction between the color-forming component A and the compound C, and a photopolymerization initiator comprising the organic dye and the organoboron compound.

15. A recording material comprising a support and at least one recording layer provided thereon which includes a photopolymerizable composition comprising: (a) a polymerizable compound having an addition-polymerizable unsaturated bond; (b) an organic dye; and (c) at least one kind of an organoboron compound represented by the following general formula (I) in a proportion of at least four moles of organoboron compound per mole of the organic dye:

            General formula (I)

wherein R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Go, Sn, Mo, Cr, Ni, As, or Se;

wherein the photopolymerizable composition includes heat-responsive microcapsules including a color-forming component A, and, outside the microcapsules, a substantially colorless compound B having in the molecule thereof a polymerizable group and a site which reacts with the color-forming component A to develop a color, and a photopolymerization initiator comprising the organic dye and the organoboron compound.

16. A recording material according to claim 15, wherein the at least one recording layer comprises a multicolor multilayer recording layer formed by lamination of layers, each of which is adopted for producing a different color.

17. A recording material according to claim 15, wherein the multicolor multilayer recording layer comprises at least one intermediate layer between the recording layers.

18. A recording material according to claim 15, wherein the recording layer includes a protective layer as an outermost layer.

19. A recording material comprising a support and at least one recording layer provided thereon which includes a photopolymerizable composition comprising: (a) a polymerizable compound having an addition-polymerizable unsaturated bond; (b) an organic dye; and (c) at least one kind of an organoboron compound represented by the following general formula (I) in a proportion of at least four moles of organoboron compound per mole of the organic dye:

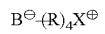            General formula (I)

wherein R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se;

wherein the photopolymerizable composition includes heat-responsive microcapsules enclosing a color-forming component A, and, outside the microcapsules, a substantially colorless compound C having a site which reacts with the color-forming component A to develop a color, a substantially colorless compound D having in the molecule thereof a polymerizable group and a site which inhibits reaction between the color-forming component A and the compound C, and a photopolymerization initiator comprising the organic dye and the organoboron compound.

20. A recording material according to claim 19, wherein the at least one recording layer comprises a multicolor multilayer recording layer formed by lamination of layers, each of which is adopted for producing a different color.

21. A recording material according to claim 19, wherein the multicolor multilayer recording layer comprises at least one intermediate layer between the recording layers.

22. A recording material according to claim 19, wherein the recording layer includes a protective layer as an outermost layer.

23. An image-recording process comprising the steps of:
(a) preparing a recording material by laminating at least one recording layer on a support, with the at least one recording layer including a photopolymerizable composition comprising (i) a polymerizable compound including an addition-polymerizable unsaturated bond, (ii) an organic dye, and (iii) at least one kind of an organoboron compound represented by the following general formula (I) in a proportion of at least four moles of organoboron compound per mole of the organic dye

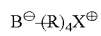   General formula (I)

wherein R is selected from the group consisting of an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof; Rs may be the same as or different from each other; two or more of these groups may join together directly or via a substituent and form a boron-containing heterocycle; and X represents an alkali metal, quaternary ammonium, pyridinium, quinolinium, diazonium, morpholinium, tetrazolium, acridinium, phosphonium, sulfonium, oxosulfonium, iodonium, S, P, Cu, A Hg, Pd, Fe, Co, Sn, Mo, Cr, Ni, As, or Se;

(b) exposing the recording layer image-wise to light at least once using at least one light source so that the photopolymerizable composition forms a latent image;

(c) heating the recording material so that the color-forming components develop colors according to the latent image to form an image; and (d) irradiating the recording layer surface with light so as to fix the image formed and decolorize the organic dyes;

wherein the step of preparing a recording material includes providing microcapsules comprising a color-forming component in at least one recording layer.

24. An image-recording process according to claim 23, wherein the step of exposing includes using a plurality of light sources of different wavelengths.

25. An image-recording process according to claim 23, wherein the step of preparing a recording material includes laminating a plurality of recording layers on the support, with the recording layers being sensitive to light of different wavelength from one another.

* * * * *